(12) United States Patent
Nomura et al.

(10) Patent No.: US 6,907,555 B1
(45) Date of Patent: Jun. 14, 2005

(54) SELF-TEST CIRCUIT AND MEMORY DEVICE INCORPORATING IT

(75) Inventors: Yukihiro Nomura, Kawasaki (JP);
Hiroyuki Fujimoto, Kawasaki (JP);
Takahiro Suzuki, Kawasaki (JP);
Tatsuya Kanda, Kawasaki (JP);
Yasurou Matsuzaki, Kawasaki (JP);
Masahiko Saitou, Kawasaki (JP);
Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 819 days.

(21) Appl. No.: 09/691,115

(22) Filed: Oct. 19, 2000

(30) Foreign Application Priority Data

Dec. 17, 1999 (JP) .......................................... 11-359999
Jun. 6, 2000 (JP) ...................................... 2000-169689

(51) Int. Cl.[7] .......................................... G11C 29/00
(52) U.S. Cl. ...................................................... 714/719
(58) Field of Search .......................... 714/719; 324/719, 324/718, 724, 733, 738, 765; 365/201

(56) References Cited

U.S. PATENT DOCUMENTS 6,108,252 A * 8/2000 Park ........................... 365/201

FOREIGN PATENT DOCUMENTS

JP 61-54550 3/1986
JP 11-39226 2/1999

* cited by examiner

*Primary Examiner*—Albert Decady
*Assistant Examiner*—James C. Kerveros
(74) *Attorney, Agent, or Firm*—Arent Fox PLLC

(57) ABSTRACT

The present invention is a self-test circuit (BIST) incorporated in the memory device, which is activated in response to a test activation signal from outside. When this self-test circuit is activated in response to a test activation signal (WBIZ) from outside, it generates a test operation command (WBI-CMD), generates a test address (WBI-ADD), and generates test data (WBI-DATA). Furthermore, after the self-test circuit writes the test data to a memory cell, it effects a comparison to establish whether or not the read data that is read from this memory cell is the same as the test data that was written thereto and stores information as to the result of this comparison. This comparison result information is then output to the outside.

38 Claims, 30 Drawing Sheets

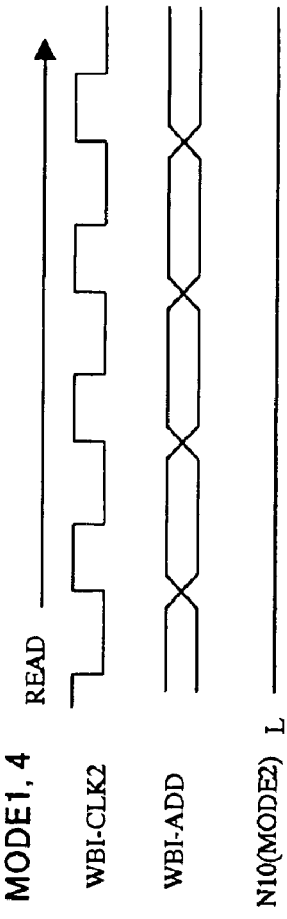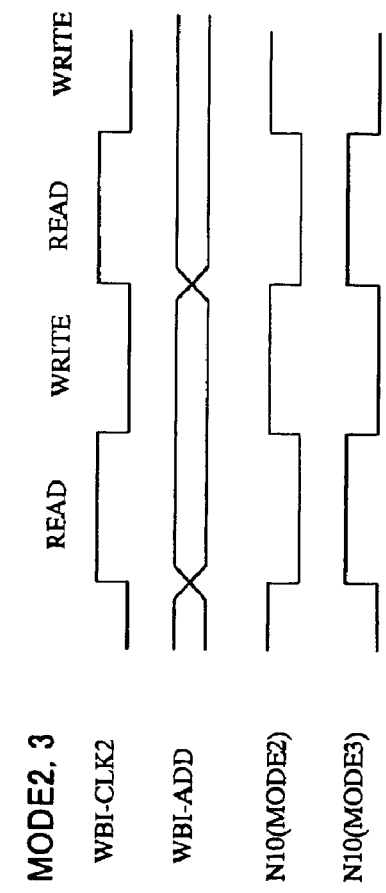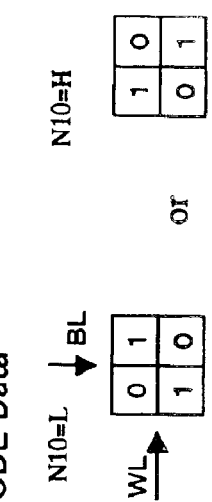
FIG. 15A  MODE1, 4
FIG. 15B  MODE2, 3
FIG. 15C  MODE Data

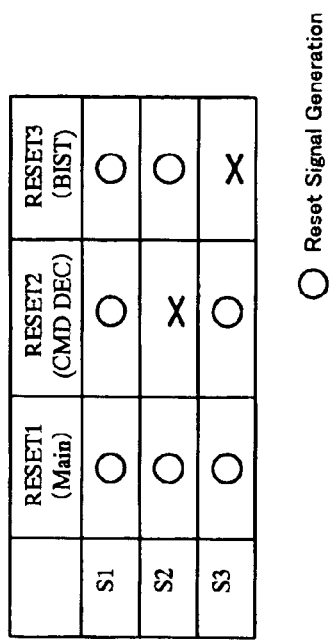
FIG. 29C
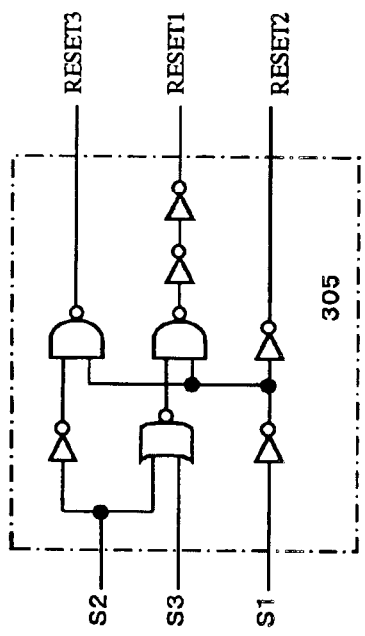
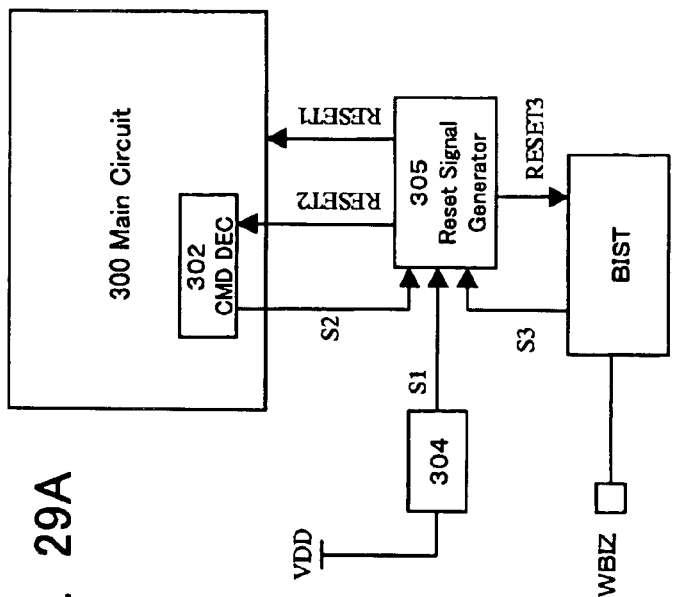
FIG. 29A
FIG. 29B

SELF-TEST CIRCUIT AND MEMORY DEVICE INCORPORATING IT

BACKGROUND OF THE INVENTION

1. Field of the Invention

The present invention relates to a self-test circuit for self-diagnosis incorporated in a memory device and in particular relates to a self-test circuit whereby self-test can be performed utilizing comparatively few input/output terminals. The present invention relates for example to self-test circuits that are suitable for burn-in testing in the wafer processing step.

2. Description of the Related Art

In recent years, memory devices such as dynamic RAM (DRAM) have been increased in capacity and scale. Concomitantly, the cost of the testing step in which inspection for failed bits within the memory is performed using an LSI tester has increased, resulting in increased costs of the memory device.

FIG. 1 is a typical layout diagram of a prior art memory device. FIG. 1 shows a typical layout taking the example of a synchronous DRAM (SDRAM). In the example of FIG. 1, a clock CLK is supplied to clock input buffer 10 from outside, and an internal clock I-CLK is supplied to each circuit block. Also, command input CMD is supplied to command decoder 12 from outside, the decoded external command CMD is latched in command latch circuit 16, and a control circuit 18 controls the circuitry within memory bank MBNK, which is the memory core, in response to this latched external command. Also, addresses A0 to An are supplied to address buffer 14 from outside, and its address EXADD is supplied to memory buffer MBNK.

A memory bank MBNK is divided into, for example, a plurality of memory blocks BLK; in each memory block there are provided a row decoder RDEC, a memory cell array MCA, a sensing amplifier SA, and a column decoder CDEC etc. Furthermore, the memory blocks are connected to a sensing buffer and write amplifier SB/WA through a database DB and are furthermore connected to an input/output terminal DQ through a data input/output circuit DI/O.

Furthermore, although not shown in the drawing, within memory bank MBNK, there are provided redundant cells that are capable of replacing failed bits. Failed bits detected by an operation test are replaced by these redundant cells, and shipped as a passed chip.

In a conventional testing step in which failed bits are detected prior to shipping, an LSI tester supplies from command input terminal CMD, address terminals A0 to An and input/output terminal DQ the operating commands, addresses, and write data etc that are required for testing, and checks whether or not the read data that is output from input/output terminal DQ is the expected data. Consequently, for example when performing a test of whether data 1 can be read or not by writing data 1, the LSI tester performs writing using an active command, write command, reset command, non-select command etc, and performs reading using an active command, read command, reset command, and de-select command etc.

This test step using an LSI tester is usually performed after the LSI chip has been accommodated in the package in the assembly step, which is a later step.

However, in the above defect testing step, it is necessary to employ an LSI tester, and a long time is required due to the increased capacity of memory. It has therefore been proposed to incorporate within a memory device a testing circuit for self-diagnosis, in order to perform the above defect test without using an LSI tester. Such a self-test circuit is called a "Built-In Self-Test (BIST) circuit (hereinbelow referred to simply as BIST circuit).

However, no consensus has yet been reached as to what construction of such a BIST circuit is most suitable. For example, if a BIST circuit is incorporated in a memory device but simply outputs "pass" or "fail" of the test, it is impossible to ascertain the number of failed bits, and so it is not possible to decide whether or not a rescue function utilizing redundant cells can be utilized. If, on the other hand, the BIST circuit stores all the addresses of failed bits, the BIST circuit itself becomes of large scale and so impracticable.

In contrast, the prior art method in which failed products that were incapable of being rescued by redundant cells were excluded by performing a diagnostic test after the subsequent step (assembly step) of the manufacturing step did not make a sufficient contribution to lowering device costs. Rescuing failed products by utilizing redundant cells converts failed products into passed products, and so contributes to lowering of costs to a certain extent. However, if the defect test is performed after the assembly step, the proportion of costs relating to the assembly step of devices that finally end up as failed products is wasted.

In order to solve such problems, it has been proposed to perform the burn-in test (accelerated test) in the preceding step (wafer level) of the manufacturing step. However, the testers for the accelerated test at the wafer stage have only a small number of probes that can be utilized, so it is difficult to perform a complicated function test such as was performed with the conventional LSI tester. It is therefore desirable to incorporate in the memory device a self-test circuit that can be utilized in the burn-in test at wafer level.

SUMMARY OF THE INVENTION

Accordingly, an object of the present invention is to provide a self-test circuit incorporated in a memory device that is adapted for rescue of failed products by utilizing redundant cells.

Also, a further object of the present invention is to provide a self-test circuit incorporated in a memory device that is capable of being operated by means of a small number of external terminals.

Yet a further object of the present invention is to provide a self-test circuit incorporated in a memory device that is capable of being utilized in a burn-in test at the wafer stage.

Yet a further object of the present invention is to provide a memory device incorporating a self-test circuit as described above.

In order to achieve the above objects, one aspect of the present invention is a self-test circuit incorporated in the memory device, which is activated in response to a test activation signal from outside. When this self-test circuit is activated in response to a test activation signal from outside, it generates a test operation command, generates a test address, and generates test data. Furthermore, after the self-test circuit writes the test data to a memory cell, it effects a comparison to establish whether or not the read data that is read from this memory cell is the same as the test data that was written thereto and stores information as to the result of this comparison. This comparison result information is then output to the outside.

A memory device that incorporates the self-test circuit is preferably provided with a self-test external terminal. A test activation signal is supplied from this self-test external terminal, a command for test purposes is supplied thereto, and the comparison result information can be output therefrom.

For the defect test, it is possible to employ for example (1) a scan pattern wherein prescribed test data are written to all the memory cells whilst incrementing the address, then all the memory cells are read, and a check is made to establish that the read data are the same as the test data, or (2) a march pattern, in which prescribed test data are written to all the memory cells whilst incrementing the address and then inverted test data are written whilst reading all the memory cells, then inverted test data are again written whilst reading all the memory cells while the address is decremented, and finally all the memory cells are read while the address is incremented.

Basically, these defect detection test patterns involve repeated reading and writing operations. In order to generate these test patterns automatically, the self-test circuit comprises a function of generating a write or read test operation command, a function of generating a test address, a function of generating test data and a function of comparing whether or not the read data coincide with the test data. In this way, this incorporated self-test circuit can automatically perform self-test internally by being supplied from outside with restricted signals utilizing restricted input/output terminals.

Preferably this self-test circuit is capable of outputting, as comparison result information, information as to whether or not rescue can be achieved by means of redundancy, so that the yield can be improved by utilizing redundant cells within the memory device. For example, the circuit that accumulates the comparison result is preferably provided with a function of counting the number of failed bits. Alternatively, the circuit that accumulates the comparison result is preferably provided with a function of outputting information as to whether or not the number of failed bits exceeds the number that can be rescued by redundant cells.

Furthermore, this self-test circuit is preferably provided with an operation mode selector circuit such as to be capable of designating the test operation mode from outside to some degree. The march pattern and/or scan pattern tests mentioned above can be implemented by combining these test operation modes. In this case, the operation of the memory core is controlled by generating an active command, read command, pre-charge command, disable command (non-selected command) etc internally in accordance with the test operation mode.

Alternatively, as a further example, the self-test circuit is preferably provided with an operation mode selector circuit capable of sequentially shifting automatically to various test operation modes in response to activation. In this case, it is unnecessary to provide a signal from outside to specify the test operation mode. In the case of this example, the test operation mode that is necessary for the test pattern is sequentially selected simply by applying from outside a test pattern such as a scan pattern or march pattern.

In a preferred embodiment, in a self-test mode, this self-test circuit executes self-test by generating a test address, test data and test operation command. Consequently, there is provided a selector that changes over between an address, write data and operation command from outside and a test address, test data and test operation command generated internally. Preferably at least a or some selectors are provided within an input circuit that inputs an external address, write data, or operation command. The reason for adopting such a construction is that more internal circuits can be made the subject of testing when performing a burn-in test.

If a selector circuit is provided in an input circuit as described above, the input circuit inputs an input signal that is changed over by the selector in synchronization with a first clock, while the self-test circuit supplies to the selector a test command, test address, and test data signal in synchronization with a second clock whose phase is advanced from said first clock. In this way, the input circuit can reliably input the test command, test address and test data signal that are internally generated.

Furthermore, if a selector circuit is provided within an input circuit as described above, when changeover to self-test mode is effected by an ordinary external command, the selector is changed over to the self-test signal side, and input of a self-test cancellation command becomes impossible. Accordingly, in a preferred embodiment, in self-test mode, there is provided a construction whereby at least a or some selectors are changed over to the external input terminal side in response to a certain condition of a prescribed external terminal.

Furthermore, in a further embodiment, there is provided a construction whereby a reset signal is supplied to the internal circuitry including at least the memory core and/or memory control circuit in response to a reset command supplied from the self-test input terminal, resetting of the internal circuitry being thereby effected. When a burn-in test is performed at wafer level, it is necessary to reset the internal circuitry by means of a reset command from a self-test input terminal provided as the terminal for self-test purposes. In this case, this self-test circuit itself is not reset.

BRIEF DESCRIPTION OF THE DRAWINGS

FIGS. 15A–15C is an operation timing chart of a test address/data generating circuit;

FIGS. 29A–29C is a view illustrating the reset function according to an eighth embodiment.

DESCRIPTION OF THE PREFERRED EMBODIMENTS

Embodiments of the present invention are described below with reference to the drawings. However, the technical scope of the present invention is not restricted to such embodiments.

Figure 1:
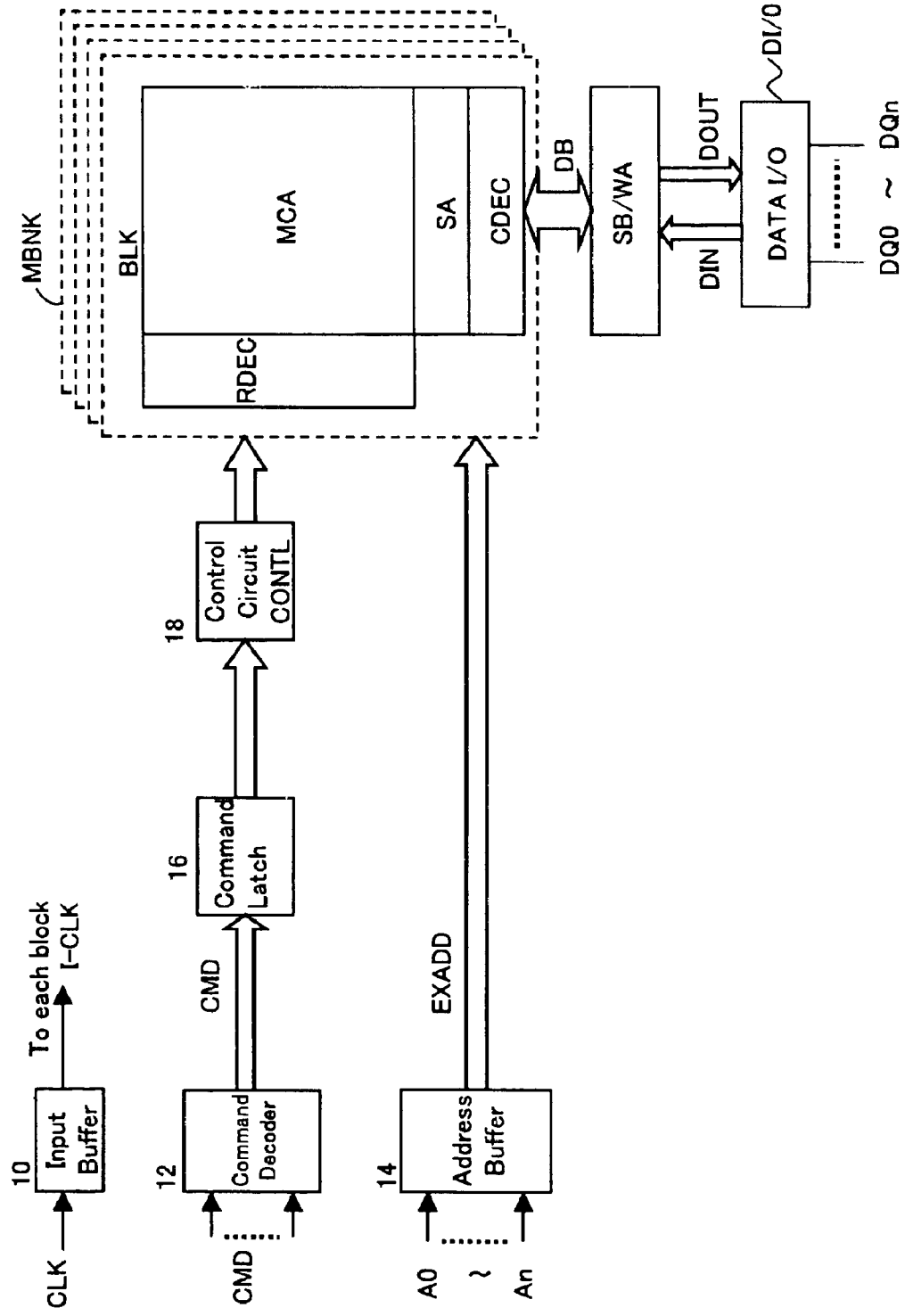
FIG. 1 is a layout diagram of a prior art memory device.
Figure 2:
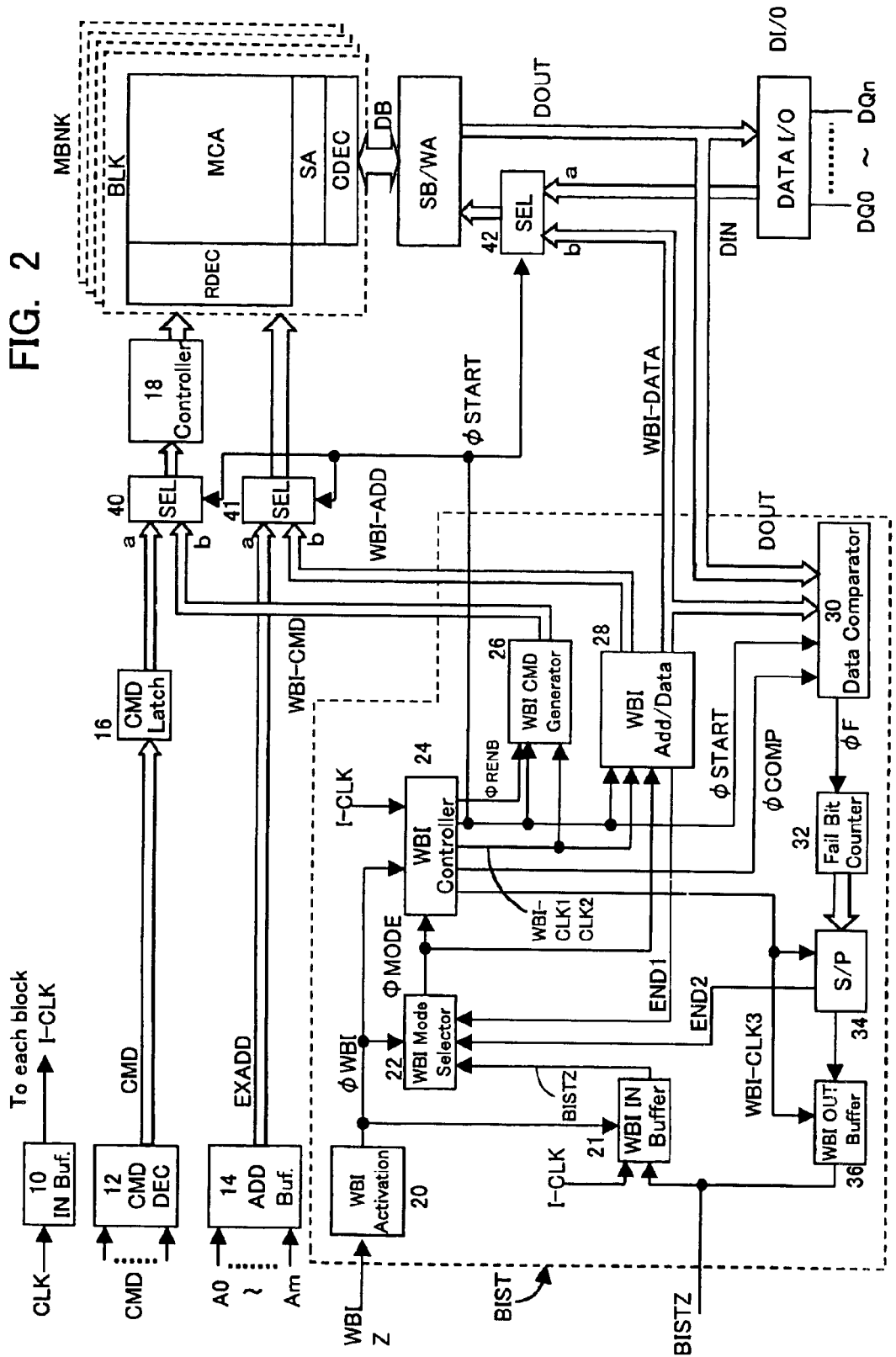
FIG. 2 is a layout diagram of a memory device according to an embodiment.

FIG. 2 is a layout diagram of a memory device according to an embodiment. The memory device illustrated in FIG. 2, in addition to memory circuit layout identical with that of the prior art example of FIG. 1, incorporates a self-test circuit BIST (Built In Self-test). It is a precondition of the self-test circuit BIST in this embodiment that it can be used in the wafer level burn-in (herein below abbreviated to WBI) step. Since there are limitations on the number of probes that can be utilized per chip in the wafer level burn-in test, a self-test circuit BIST that is capable of performing self-diagnosis in which the number of failed bits is detected notwithstanding such restrictions on the number of probes will be described. However, this self-test circuit BIST can be utilized not just in the wafer level burn-in test but also in test steps subsequent to the assembly step.

Also, there are for example four types of test operation mode in self-test. Firstly, there is the mode (MODE1) in which data is written while incrementing the address; secondly, there is the mode (MODE2) in which, simultaneously with reading data from memory while incrementing the address, data which are the inverse thereof are written; thirdly, there is the mode in which, simultaneously with reading data from memory while decrementing the address, data which are the inverse thereof are written (MODE3); and fourthly there is the mode in which data are read from memory while incrementing the address (MODE4). Apart from these, self-test also requires a mode in which the test results are output externally. Various test patterns can be implemented by combining the above four test operation modes. The details of these will be described later.

In order to implement the various test operation modes, it is necessary to generate operation commands for reading or writing of the memory device and to apply these to the memory device. Describing for example the case of an SDRAM (synchronous DRAM), in the first mode MODE1, it is necessary to apply to the memory device continuously at each address the active command, write command, precharge command, and deselect command. Also, in the case of an FCRAM (Fast Cycle RAM), it is necessary to apply operation commands such as active write and active read. The operation commands that are utilized in ordinary operation by the memory device are generated by the self-test circuit and supplied to the control circuitry of the memory.

The memory circuit portion of FIG. 2 is the same as that of the prior art example of FIG. 1 and the same reference numerals are applied thereto. In memory bank MBNK, which is the core memory, a redundant memory cell array, not shown, which can replace failed bits, is provided adjacent to the ordinary memory cell array.

In the self-test circuit BIST of the embodiment shown in FIG. 2, there are provided: (1) a WBI activation circuit 20 for activating self-test circuit BIST in response to an activation signal WBIZ from outside, (2) a test operation mode selector circuit 22 for selecting a test operation mode in accordance with an operation mode input signal BISTZ from outside, (3) a WBI control circuit 24 for generating a test clock etc constituting a control signal and/or timing signal in accordance with the test operation mode signal øMODE, (4) a WBI command generating circuit 26 for generating a test operation command WBI-CMD corresponding to the test operation mode, (5) a WBI address/data generating circuit 28 for generating test addresses WBI-ADD and test data WBI-DATA corresponding to the test operation mode, (6) a data comparison unit 30 for comparing the read output data DOUT from a memory cell with the test data WBI-DATA and generating a fail signal øF if these are different, (7) a failed bit counter 32 for counting as test result information the number of times the fail signal øF is generated, (8) a parallel-serial conversion circuit 34, and (9) a WBI output buffer 36 that outputs the serial data.

The above test operation command WBI-CMD is supplied to control circuit 18 in the memory device through selector 40. Likewise, the test address WBI-ADD is supplied to the memory core (memory bank) MBNK in the memory device through selector 41, and test data WBI-DATA is supplied to write amplifier WA through selector 42. These selectors 40, 41, 42 are changed over to respective signals from self-test circuit BIST by a start signal øSTART that is generated by test control circuit 24 when in each test operation mode. During ordinary operation, the external command CMD from command latch 16, the external address EXADD from address buffer 14, and input data DIN from data input/output circuit DI/O are respectively selected and supplied to the memory core etc.

Consequently, in normal operation, the signal a side is selected at each selector, and normal operation is performed in accordance with the external operation command CMD, external address EXADD, and input data DIN.

Then, in for example a wafer level burn-in test, WBI activation circuit 20 generates an activation signal øWBI by supplying activation signal WBIZ, thereby activating test operation mode selector circuit 22 and WBI control circuit 24. Test operation mode selector circuit 22 selects the test operation mode by decoding the mode input signal BISTZ that is serially input from outside and applied thereto through WBI input buffer 21. That is, test operation mode selector circuit 22 generates test operation mode signal øMODE. In response to this test operation mode signal øMODE, WBI control circuit 24 respectively supplies first test clock WBI-CLK1 and second test clock WBI-CLK2 for test operation purposes to WBI command generating circuit 26 and WBI address/data generating circuit 28, and generates the start signal øSTART of each test operation mode.

In response to this start signal øSTART, selectors 40, 41, 42 select the signal b side. Then, WBI command generating circuit 26 generates test operation command WBI-CMD in accordance with the test operation mode, with the timing of the first test clock WBI-CLK1. Also, WBI address/data generating circuit 28 generates test address WBI-ADD and test data WBI-DATA in accordance with the test operation mode, with the timing of the second test clock WBI-CLK2. The memory circuit executes read operation and/or write operation in accordance with the test operation mode, in response to the supply of these test operation commands, test addresses and test data. Data comparison unit 30 compares the output data DOUT that is read from the memory cell with the test data WBI-DATA that is written and the fail signal øF that is generated in the event that these do not coincide is counted by counter 32. This count value is subjected to parallel/serial conversion, and is output serially from signal terminal BISTZ by test output buffer 36.

The output terminal that is supplied with the above activation signal WBIZ and the signal terminal BISTZ are special external terminals that are utilized only during for example a wafer level burn-in test. These terminals WBI, BISTZ, clock terminal CLK and power source terminal are terminals necessary during WBI testing and are constituted such that the self-test circuit BIST can cope with the restrictions on the number of probes.

Figure 3:
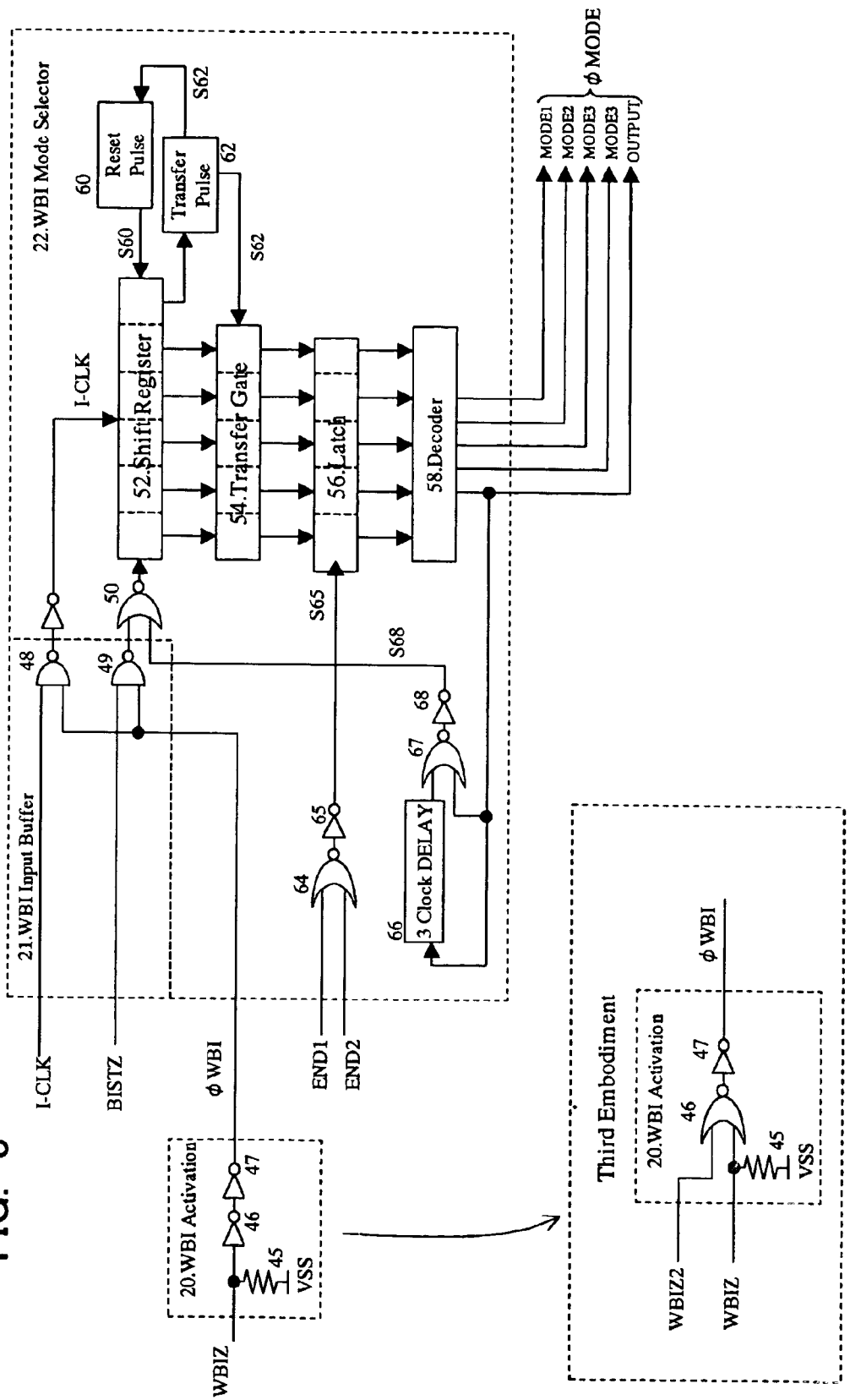
FIG. 3 is a circuit diagram illustrating a WBI activation circuit, WBI input buffer, and WBI mode selector circuit.

Next, entry of the self-test step and output of the test result information will be described. FIG. 3 is a circuit diagram showing the WBI activation circuit, WBI input buffer, and WBI mode selector circuit. Also, FIG. 4 is a timing chart of operation on entry into the self-test step, and FIG. 5 is a timing chart of operation during output of the test result information.

WBI activation circuit 20 comprises a resistance 45 whereby terminal WBIZ that is supplied with the activation signal is connected to ground Vss and inverters 46, 47. Consequently, when terminal WBIZ is in open condition, the WBI activation signal øWBI is made L level by resistance 45 and the NAND gates 48, 49 in WBI input buffer 21 are closed. When an H level activation signal WBIZ is applied, the internal WBI activation signal øWBI becomes H level, putting the NAND gates 48, 49 in WBI input buffer 21 in open condition, so that the clock I-CLK and mode input signal BISTZ are respectively passed. Consequently, during self-test, the activation signal WBIZ from outside is maintained at H level.

In synchronization with the clock I-CLK, WBI mode selector circuit 22 serially inputs the mode input signal BISTZ, decodes it, and generates the corresponding WBI mode signal øMODE. For this purpose, WBI mode selector circuit 22 is provided with a shift register 52 that is supplied with mode input signal BISTZ that is transferred serially thereto by way of WBI input buffer 21, transfer gate 54 that transfers the mode input signals BISTZ of a plurality of bits, latch circuit 56, and decoder 58.

Figure 4:
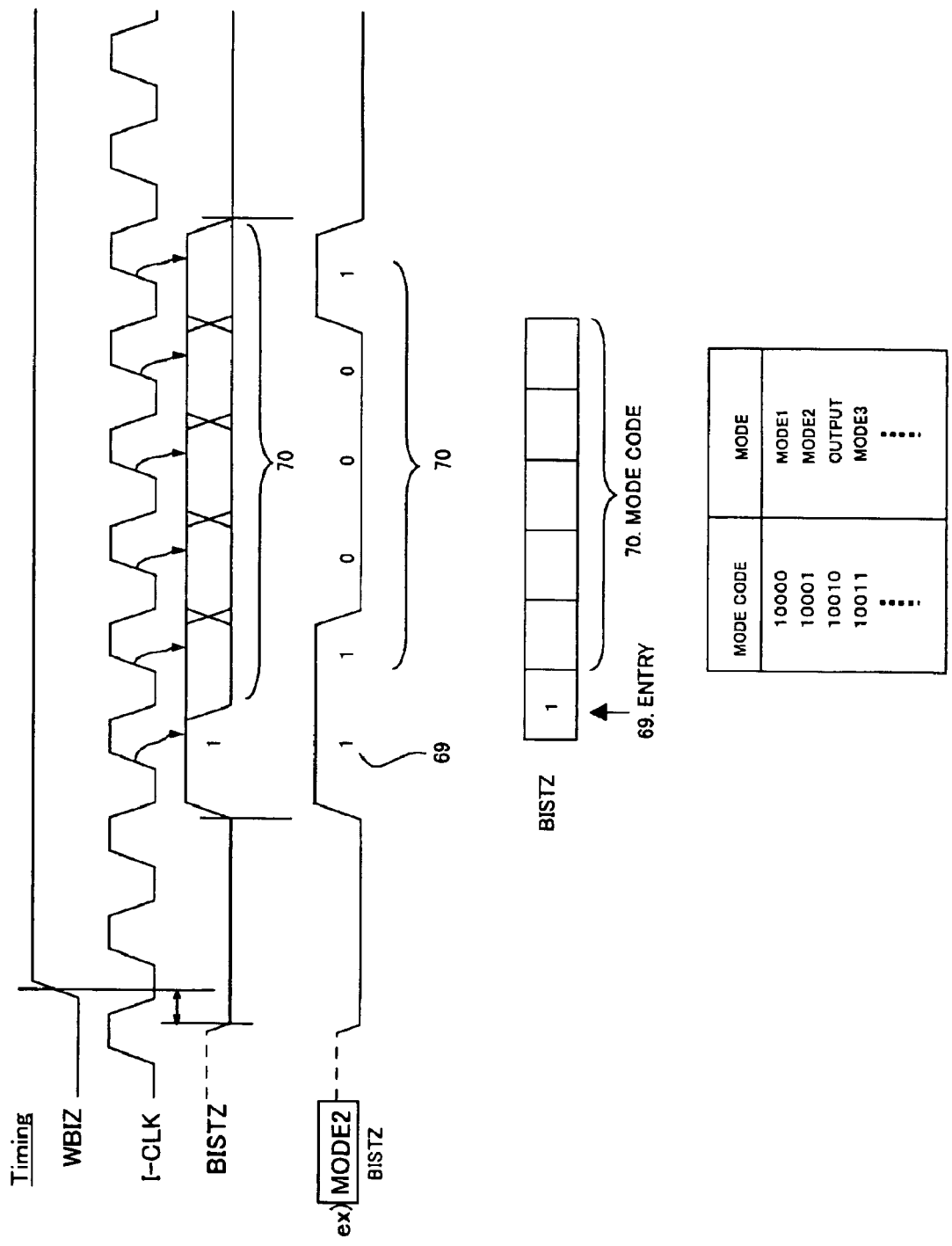
FIG. 4 is an operation timing chart of entry into the self-test step.
Figure 5:
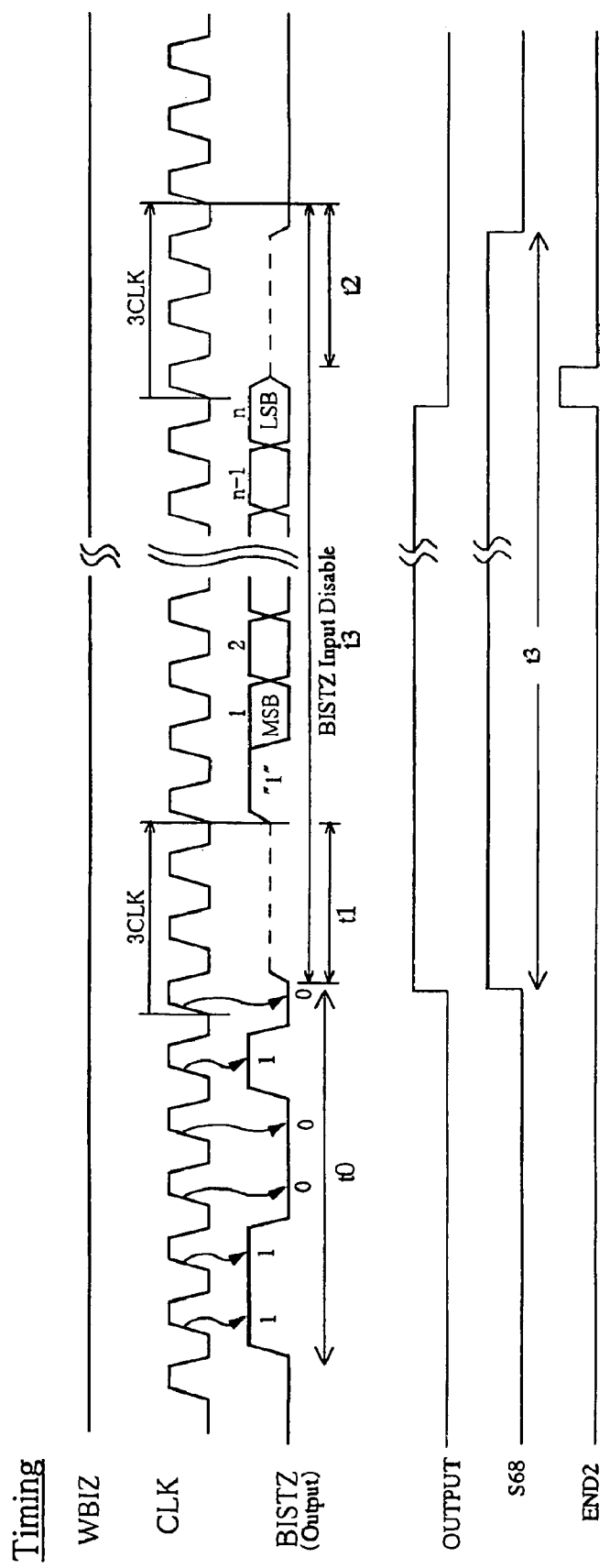
FIG. 5 is an operation timing chart on output of test result information.

As shown in FIG. 4, mode input signal BISTZ is constituted by a single-bit entry code 69 and 5-bit mode code 70. In order to enter each test mode of the self-test step, entry code 69 is set to "1" and subsequently the mode code 70 is supplied in serial fashion. The mode code 70 is set in correspondence with a plurality of test operation modes as shown in the Table of FIG. 4. For example, in the case of the second test operation mode MODE2, as the mode input signal BISTZ, "110001" is input to shift register 52. Consequently, when all 6 bits are supplied to shift register 52, transfer pulse generating unit 62 generates a transfer signal S62, causing transfer gate 54 to transfer the mode code 70 of the mode input signal BISTZ in shift register 52 to latch circuit 56. Then, in response to transfer signal S62, reset pulse generating unit 60 generates a reset signal S60, causing shift register 52 to be reset. The mode code that is latched in latch circuit 56 is then decoded by decoder 58 and, as shown in the Table of FIG. 4, one or other of the corresponding test operation mode signals øMODE is thereby made H level.

When the various test operation modes are executed, one or other of the end signals END1, END2 becomes an H level pulse, the condition of latch circuit 56 is latched by reset signal S65, and all of the test operation mode signals øMODE become L level.

FIG. 5 is an operation timing chart on output of the test result information. In period t0, when "100010" is supplied as mode input signal BISTZ, as shown in the corresponding Table of FIG. 4, the output mode OUTPUT corresponding to mode code "10010" becomes H level. The test operation mode signal OUTPUT is also supplied to three clock pulse delay circuit 66 and NOR gate 67, and mode input control signal S68 becomes H level. The H level of this signal S68 puts NOR gate 50 in closed condition, thereby inhibiting input of the mode input signal BISTZ. That is, in period t3, input of mode input signal BISTZ is disabled. In period t3, the input-disabled condition continues also for a period t2 of three clock pulses after the output mode signal OUTPUT has become L level.

In addition, in the self-test step, the input terminal BISTZ is employed as an output terminal. Consequently, in the period t3, both input and output are disabled during the initial period of three clock pulses t1 and final period of three clock pulses t2, thereby avoiding conflict of input and output at terminal BISTZ. That is, in periods t1 and t2, terminal BISTZ goes into H impedance condition in order to effect changeover of input and output.

As shown in FIG. 5, WBI output buffer circuit 36 outputs from terminal BISTZ H level signal "1" for output recognition and following this the count value of failed bit counter 32 in serial fashion. When the end signal END2 is supplied from parallel/serial conversion circuit 34, the latch condition is reset in WBI mode selection circuit 22 by supplying the reset signal S65 through NOR gate 64 and inverter 65 to latch circuit 56. Accompanying this, the output mode signal OUTPUT becomes L level, and the mode input control signal S68 becomes L level after a period t2 of three clock pulses, with the result that input of mode input signal BISTZ is enabled.

Figure 6:
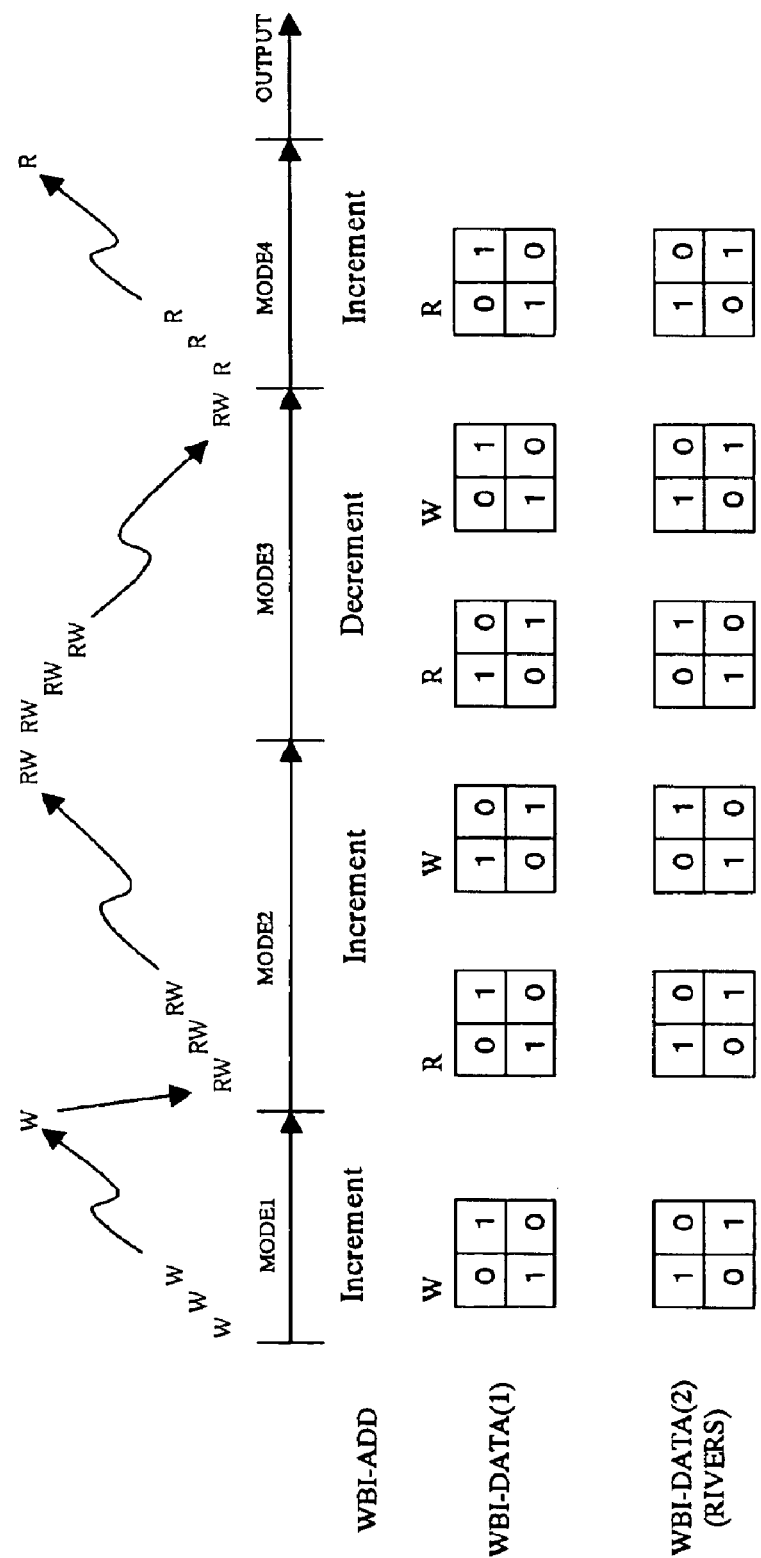
FIG. 6 is a view showing the operation of march constituting an example of a test pattern.

Next, the test patterns, test operation modes, and the test operation commands associated therewith will be described. FIG. 6 is a view showing the operation of march, which is one example of a test pattern. march is a test pattern in which the four test operation modes MODE1, 2, 3, 4 described above and the output mode OUTPUT are sequentially executed.

Specifically, in march, as shown in FIG. 6, first of all, the first mode MODE1 is executed, in which data is written while incrementing the address; next, the second mode MODE2 is executed in which data which are the inverse of this are written at the same time as data are read from the memory cells, whilst incrementing the address; next, the third mode MODE3 is executed, in which data which are the inverse thereof are written simultaneously with reading the data from the memory cells while decrementing the address; next, the fourth mode MODE4 is executed, in which data are read from the memory cells whilst incrementing the address. Finally, in the output mode OUTPUT, the failed bit information accumulated in failed bit counter 32 is output.

FIG. 6 shows an example of the test data WBI-DATA in each test operation mode. If (1) is assumed to be the uninverted pattern, (2) is the inverted pattern, which is the inverse thereof. In the case of the uninverted pattern (1), for example a checkered pattern of "0" and "1" as shown in the drawing is written (W in the drawing) to adjacent memory cells, and is read (R in the drawing). The test data WBI-DATA that was written in the first mode MODE1 is read in the second mode MODE2, and the inverted data thereof is written. In addition, in the third mode MODE3, the inverted data that was written in the second mode MODE2 is read, and the inverted data thereof is written. Then, in the final fourth mode MODE4, the inverted data thereof is read. As shown in FIG. 6, the test addresses WBI-ADD in each mode are sequentially incremented, incremented, decremented, and incremented.

In the march pattern, either the four modes MODE1 to 4 may be executed only in the aforementioned uninverted pattern or the respective four modes MODE1 to 4 may be executed in the aforementioned uninverted pattern and inverted pattern. Consequently, if the test is executed using just the uninverted pattern, if a single bit in the memory core is defective, the defect is detected once on each occasion during the three READ operations in the four test operation modes, with the result that a total of three fail signals øF are generated. If the respective four test operation modes are executed in both the uninverted pattern and inverted pattern, a total of six fail signals øF are generated.

FIG. 7 to FIG. 10 are operation timing charts of the four test operation modes. In the first mode MODE1 shown in FIG. 7, data WBI-DATA is written to the memory cells while incrementing the test addresses WBI-ADD. To achieve this, the test operation commands active ACTV, write WR, pre-charge PRE, and deselect DSEL are successively generated in synchronization with the first test clock WBI-CLK1, which is synchronized with the clock I-CLK. Concurrently, the test address WBI-ADD is sequentially incremented from A0 in synchronization with the second test clock WBI-CLK2, which is obtained from the clock I-CLK by frequency division of ¼. Also, for the test data WBI-DATA, the prescribed data shown in FIG. 6 are generated. In the first mode MODE1, the read operation is not performed, so the read enable signal ø RENB stays at L level and the third test clock WBI-CLK3 that is supplied to the serial/parallel conversion circuit 34 and WBI output buffer 36 also stays at L level.

Figure 8:
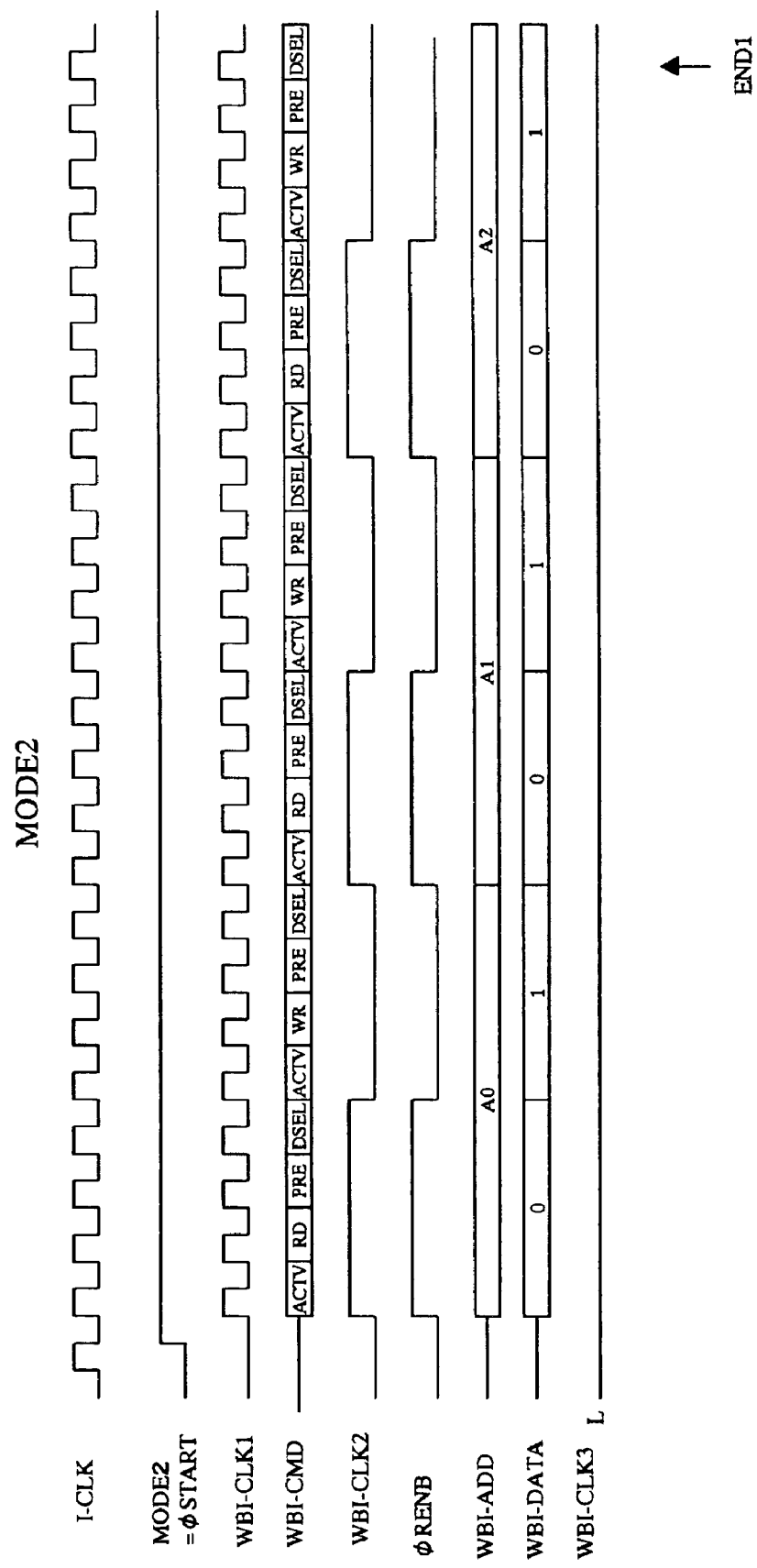
FIG. 8 is an operation timing chart of a test operation mode MODE2.

In the second mode MODE2 shown in FIG. 8, data WBI-DATA 6 is read from the memory cells whilst incrementing the test address WBI-ADD, and inverted data WBI-DATA is written to the memory cells. To achieve this, reading is performed by successively generating the test operation commands active ACTV, read RD, pre-charge PRE, and deselect DSEL in synchronization with the first test clock WBI-CLK1, which is synchronized with the clock I-CLK. In addition, writing is performed by successively generating active ACTV, write WR, pre-charge PRE and deselect DSEL.

The aforementioned reading and writing are alternately repeated in synchronization with the second test clock WBI-CLK2, which is obtained by frequency division of clock I-CLK to ⅛. Accompanying this, the read enable signal øRENB also alternately repeats H level (read enabled) and L level (read disabled) in synchronization with second test clock WBI-CLK 2. Also, test address WBI-ADD is sequentially incremented from A0 in synchronization with the second test clock WBI-CLK2. Also, the test data WBI-DATA, in the read-enabled condition (øRENB=H), is set to the first data "0" as expected value and, in the write condition (øRENB=L), is set to the second data "1", which is the inverse thereof, as write data. It should be noted that the first data and second data may be for example mutually inverted checkered patterns as illustrated in FIG. 6.

Figure 9:
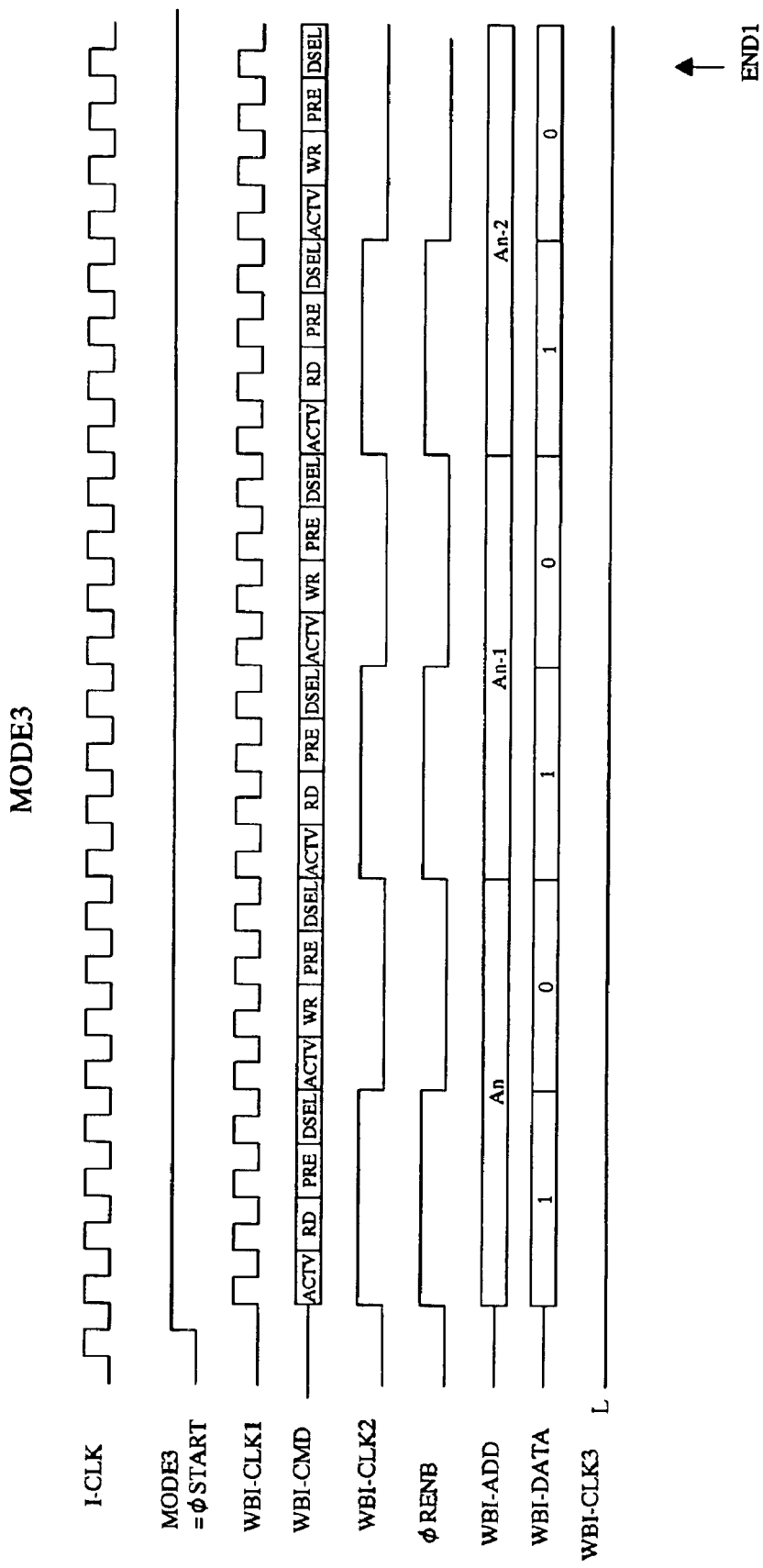
FIG. 9 is an operation timing chart of a test operation mode MODE3.

In the third mode MODE3 shown in FIG. 9, data WBI-DATA is read from the memory cells whilst decrementing the test address WBI-ADD, and the inverted data WBI-DATA is written to these memory cells. Consequently, the difference from the second mode MODE2 is that the test address WBI-ADD is decremented from An in synchronization with the second test clock WBI-CLK2 and that the test data WBI-DATA, in the read-enabled condition (øRENB=H), is set to the second data "1" as expected value and, in the write condition (øRENB=L), is set to the first data "0", which is the inverse of this, as write data.

Figure 10:
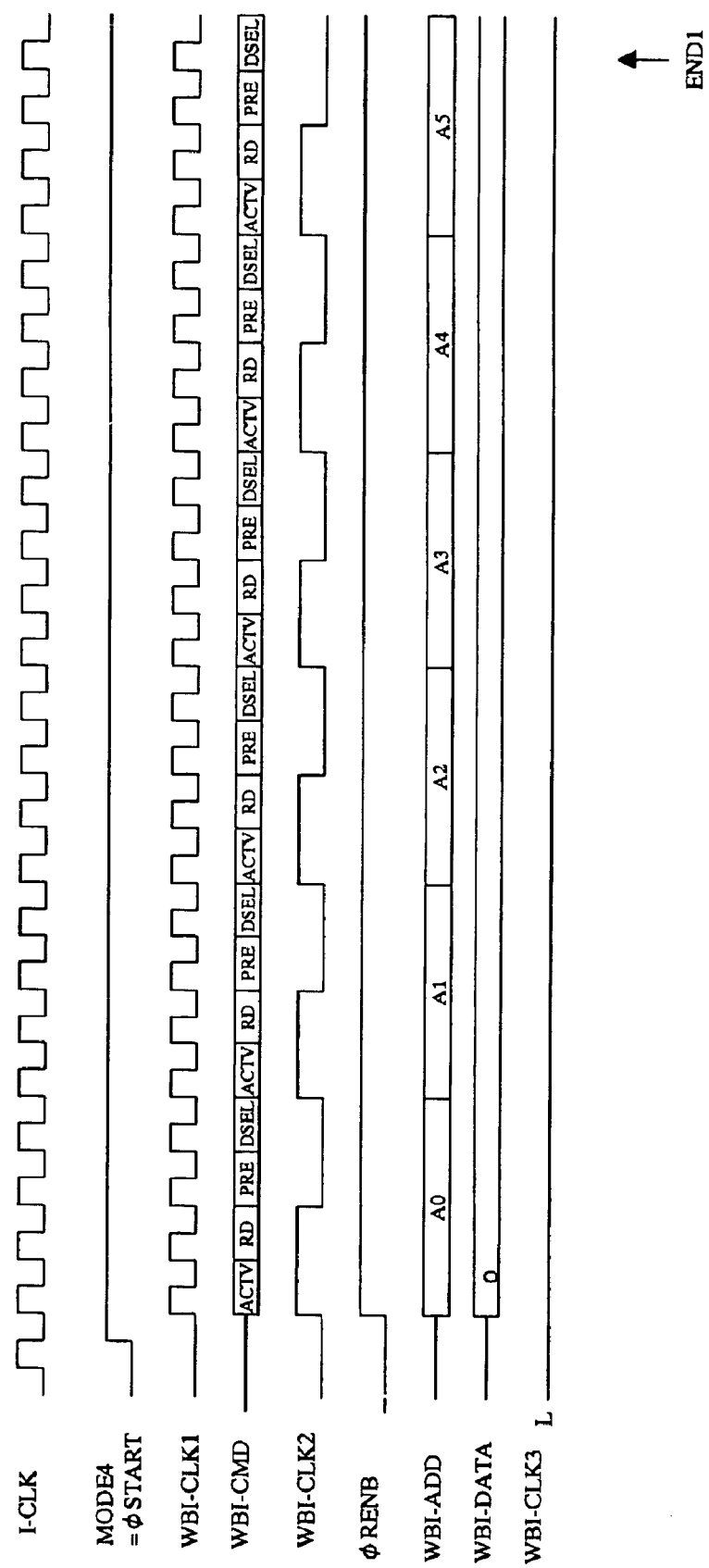
FIG. 10 is an operation timing chart of a test operation mode MODE4.

In the fourth mode MODE4 shown in FIG. 10, the data WBI-DATA is read from the memory cells whilst incrementing the test address WBI-ADD. Consequently, reading is performed by successively generating active ACTV, read RD, pre-charge PRE, and deselect DSEL in synchronization with the first test clock WBI-CLK1. Concomitantly with this, the test address WBI-ADD is sequentially incremented from A0 in synchronization with the second test clock WBI-CLK2, which is obtained by frequency division of clock I-CLK to ¼. Also, for the test data WBI-DATA, the data written in third mode MODE3 is generated as expected value. Since, in the fourth mode MODE4, only the read operation is performed, the read enable signal øRENB stays at H level, and the third test clock WBI-CLK3 that is supplied to serial/parallel conversion circuit 34 and WBI output buffer 36 stay at L level.

Figure 11:
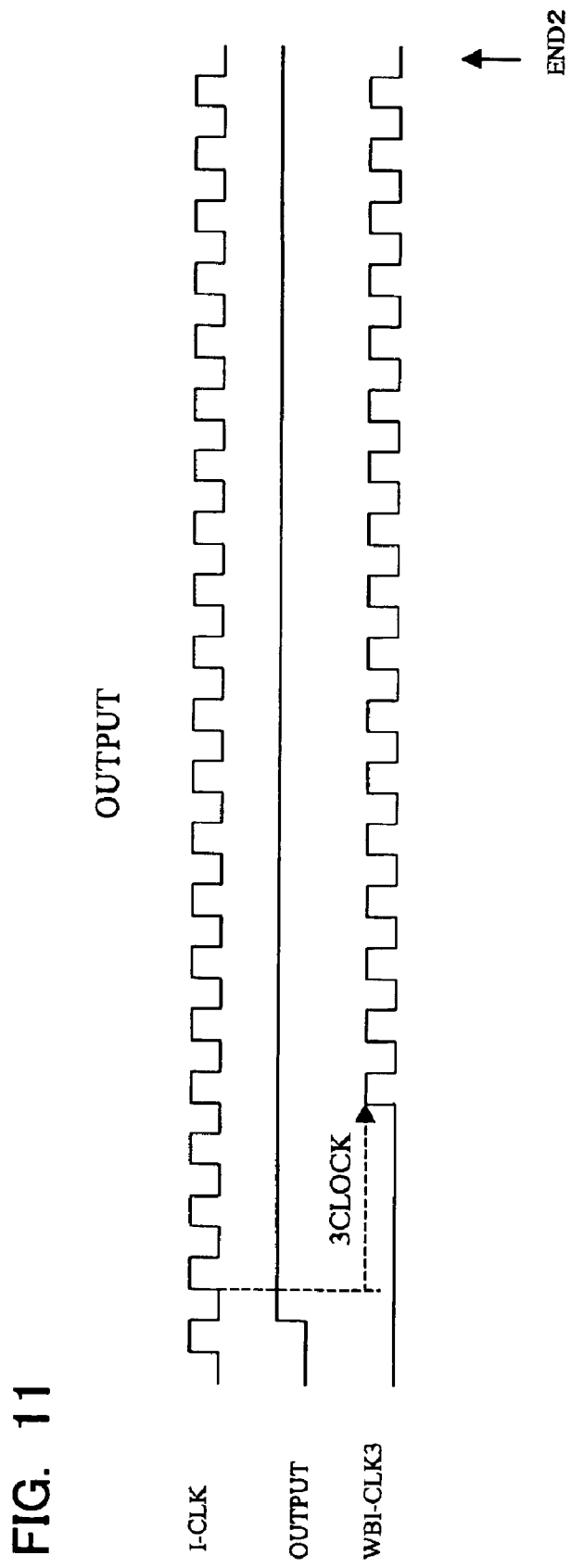
FIG. 11 is an operation timing chart of a test operation mode OUTPUT.

In the case of the output mode OUTPUT shown in FIG. 11, the third test clock WBI-CLK3 synchronized with clock I-CLK is generated after three clock cycles after the output mode signal OUTPUT becomes H level, causing the parallel/serial conversion circuit 34 and WBI output buffer 36 to operate synchronously therewith, so that the count value of failed bit counter 32 is serially output.

Figure 12:
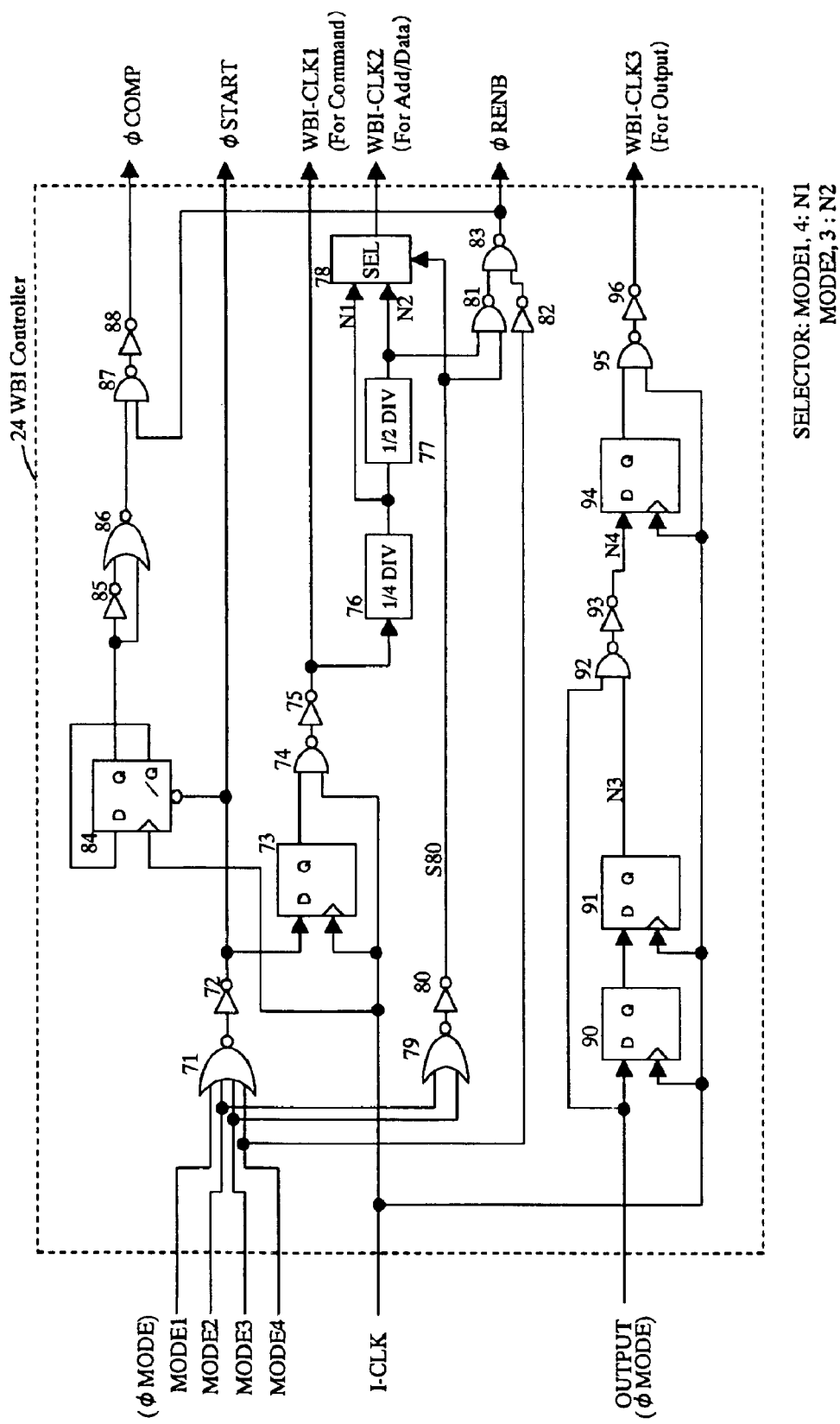
FIG. 12 is a circuit diagram of a WBI control circuit.

FIG. 12 is a circuit diagram of the WBI control circuit. In response to the test operation mode signal øMODE from WBI mode selector circuit 22, WBI control circuit 24 generates test mode start signal øSTART, first test clock WBI-CLK1 for command generation, second test clock WBI-CLK2 for address/data generation, third test clock WBI-CLK3 for test result output, read enable signal øRENB, and comparison timing signal øCOMP, which is the timing for data comparison.

Figure 7:
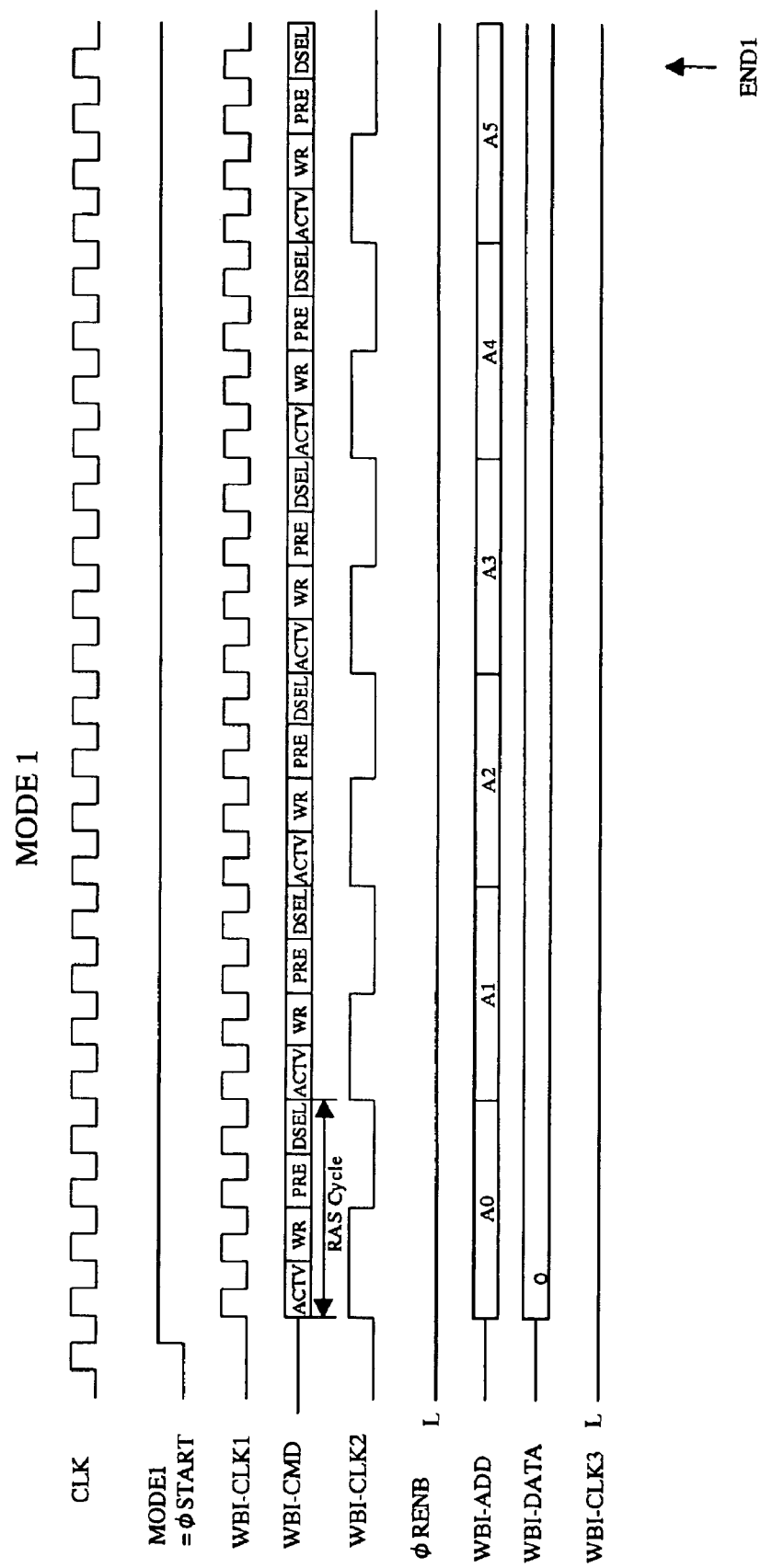
FIG. 7 is an operation timing chart of a test operation mode MODE1.

In the first mode MODE1, as shown in FIG. 7, the test mode start signal øSTART becomes H level in response to the mode signal MODE1, first test clock WBI-CLK1 is generated in synchronization with the clock I-CLK, and second test clock WBI-CLK2 is generated by frequency division of clock I-CLK to ¼.

When the first mode signal MODE 1 becomes H level, the output of NOR gate 71 becomes L level, and the test mode start signal øSTART becomes H level through inverter 72. The H level of this start signal øSTART is latched by flip-flop 73, so that the output 0 of flip-flop 73 becomes H level. Consequently, thereafter, first test clock WBI-CLK 1 is generated synchronized with internal clock I-CLK. Also, the first test clock WBI-CLK 1 is output as second test clock WBI-CLK2 through selector 78 after being divided to ¼ by a ¼ frequency divider 76.

In the case of the first mode MODE1, since this is a write operation, the read enable signal øRENB stays at L level. Consequently, the output of NAND gate 87 is held at H level, and the comparison timing signal øCOMP stays at L level.

In the second mode MODE2, as shown in FIG. 8, the test mode start signal øSTART becomes H level in response to the mode signal MODE2, the first test clock WBI-CLK 1 is generated in synchronization with the clock I-CLK, and second test clock WBI-CLK2 obtained by frequency division to ⅛ of clock I-CLK is generated, also, the read enable signal øRENB becomes H level with the read timing, and the comparison timing signal øCOMP also becomes H level.

When the second mode signal MODE2 becomes H level, the mode start signal øSTART becomes H level through NOR gate 71 and inverter 72, causing first test clock WBI-CLK 1 to be generated. Since the second mode signal MODE2 is H level, the H level selector signal S80 is supplied to selector 78 through NOR gate 79 and inverter 80, causing node N2 to be selected; second test clock WBI-CLK2 obtained by frequency division to ⅛ of first test clock WBI-CLK 1 is generated by ¼ frequency divider 76 and ½ frequency divider 77.

Then, through NAND gate 81 and 83, the read enable signal øRENB also becomes H level, in synchronization with the second test clock WBI-CLK2 (utilizing the signal of node N2). Furthermore, when the read enable signal øRENB is H level, a pulse synchronized with the trailing edge of internal clock I-CLK is output as comparison timing signal øCOMP through flip-flop 84 having a ½ frequency dividing function, inverter 85 and NOR gate 86 that generate a pulse on the trailing edge, NAND gate 87 and inverter 88.

In the case of the third mode MODE3, WBI control circuit 24 performs the same operation as in the case of the second mode MODE2.

In the case of the fourth mode MODE4, as shown in FIG. 10, the test mode start signal øSTART becomes H level in response to mode signal MODE4, causing the first test clock WBI-CLK1 to be generated in synchronization with the clock I-CLK and second test clock WBI-CLK2 to be generated by frequency division to ¼ of clock I-CLK.

When the fourth mode signal MODE4 becomes H level, the output of NOR gate 71 becomes L level, and the test mode start signal øSTART becomes H level through inverter 72. The H level of this start signal øSTART is latched in flip-flop 73, with the result that the output Q of flip-flop 73 becomes H level. Consequently, thereafter, first test clock WBI-CLK1 is generated synchronized with the internal clock I-CLK. Also, the first test clock WBI-CLK 1 is output as the second test clock WBI-CLK2 through selector 78 by frequency division to ¼ by a ¼ frequency divider. The fourth mode signal MODE4 is H level, so the read enable signal øRENB is maintained at H level through inverter 82 and NAND gate 83. Concurrently, the comparison timing signal øCOMP is output at every second clock pulse of internal clock I-CLK.

In the output mode OUTPUT, the mode signal OUTPUT becomes H level. This H level is obtained by flip-flops 90 and 91 in synchronization with the internal clock I-CLK. Consequently, after the mode signal OUTPUT becomes H level, node N3 becomes H level two clock pulses later, the output of NAND gate 92 becomes L level, and node N4 becomes H level. The H level of this node N4 is obtained by the flip-flop 94 in synchronization with the rising edge of the next internal clock I-CLK, thereby causing generation of the third test clock WBI-CLK 3 to be commenced.

That is, the operation of the WBI output buffer circuit 36 is delayed by a time t1 shown in FIG. 5 by these circuits. Then, at this time t1, changeover of external terminal BISTZ from input to output is performed. Also, with these circuits, when the output mode signal OUTPUT drops to L level, this is immediately detected by NAND gate 92, and at the rising edge of the next internal clock I-CLK is stored in flip-flop 94, causing the generation of the third test clock WBI-CLK 3 to be stopped.

Figure 13:
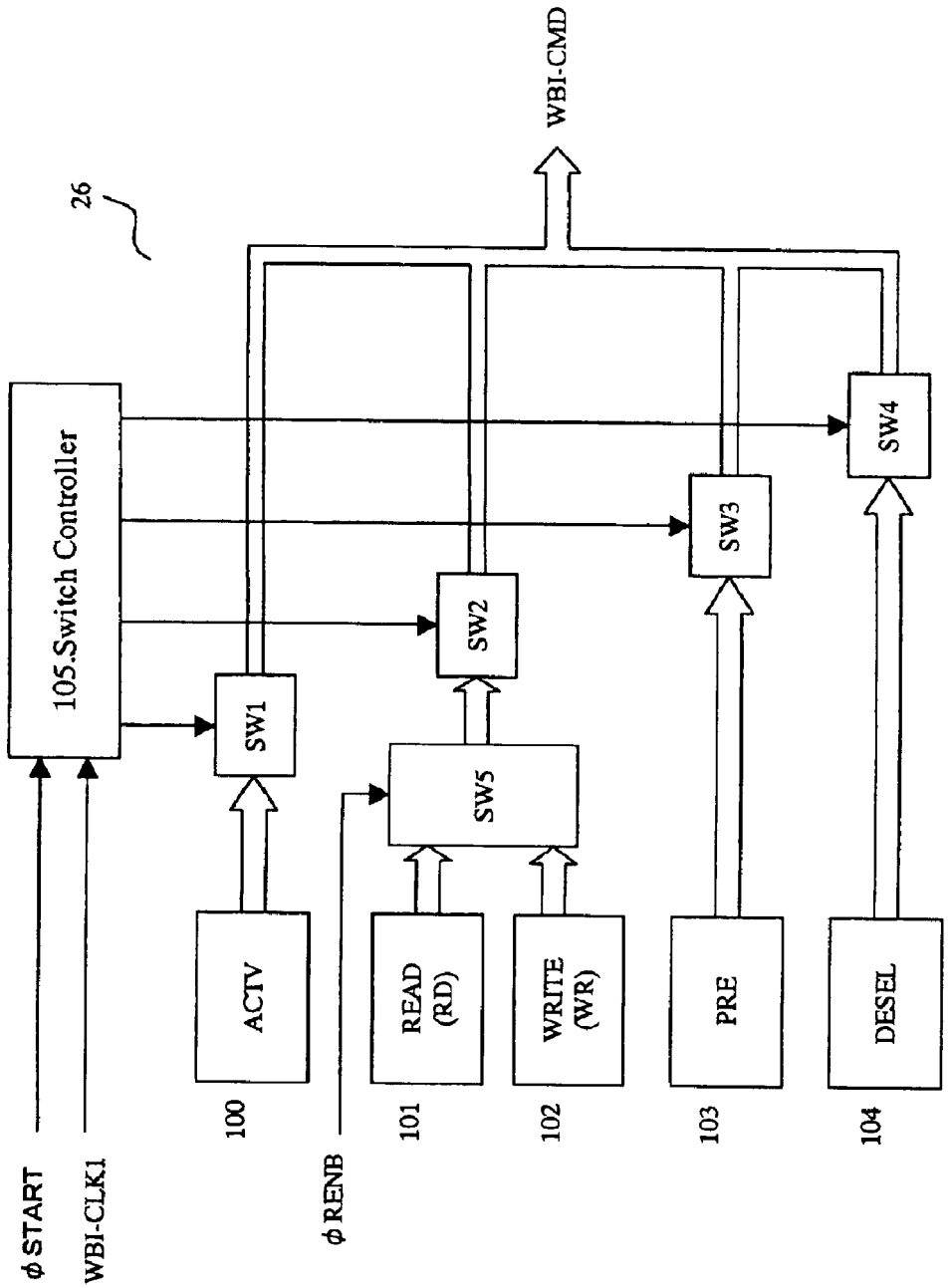
FIG. 13 is a circuit diagram of a WBI command generating circuit.

FIG. 13 is a circuit diagram of the WBI command generating circuit. The WBI command generating circuit is a test operation command generating circuit that generates a test operation command WBI-CMD designating writing or reading and supplies this to memory control circuit 18. WBI command generating circuit 26 is provided with command sets 100 to 104 that respectively output signal sets (/CS, /RAS, /CAS, /WE) of active command ACTV, read command RD, write command WR, pre-charge command PRE, and deselect command DESEL, and also a switch control circuit 105 that successively selects a signal set from the set of these commands in synchronization with the rising edge of first test clock WBI-CLK1 whilst operation of mode start signal øSTART is H level. Switches SW1 to SW4 are successively put in ON condition by the control signal from switch control circuit 105. Also, the selection of read command and write command is performed by a switch SW5 in accordance with the read enable signal øRENB.

The test operation commands WBI-CMD indicated in FIG. 7 to FIG. 10 are generated in cyclic fashion synchronously with the first test clock WBI-CLK1, which is the clock for command generation, by this WBI command generating circuit 26. As shown in FIG. 2, these test operation commands WBI-CMD are supplied to control circuit 18 of the memory circuit through selector 40.

Figure 14:
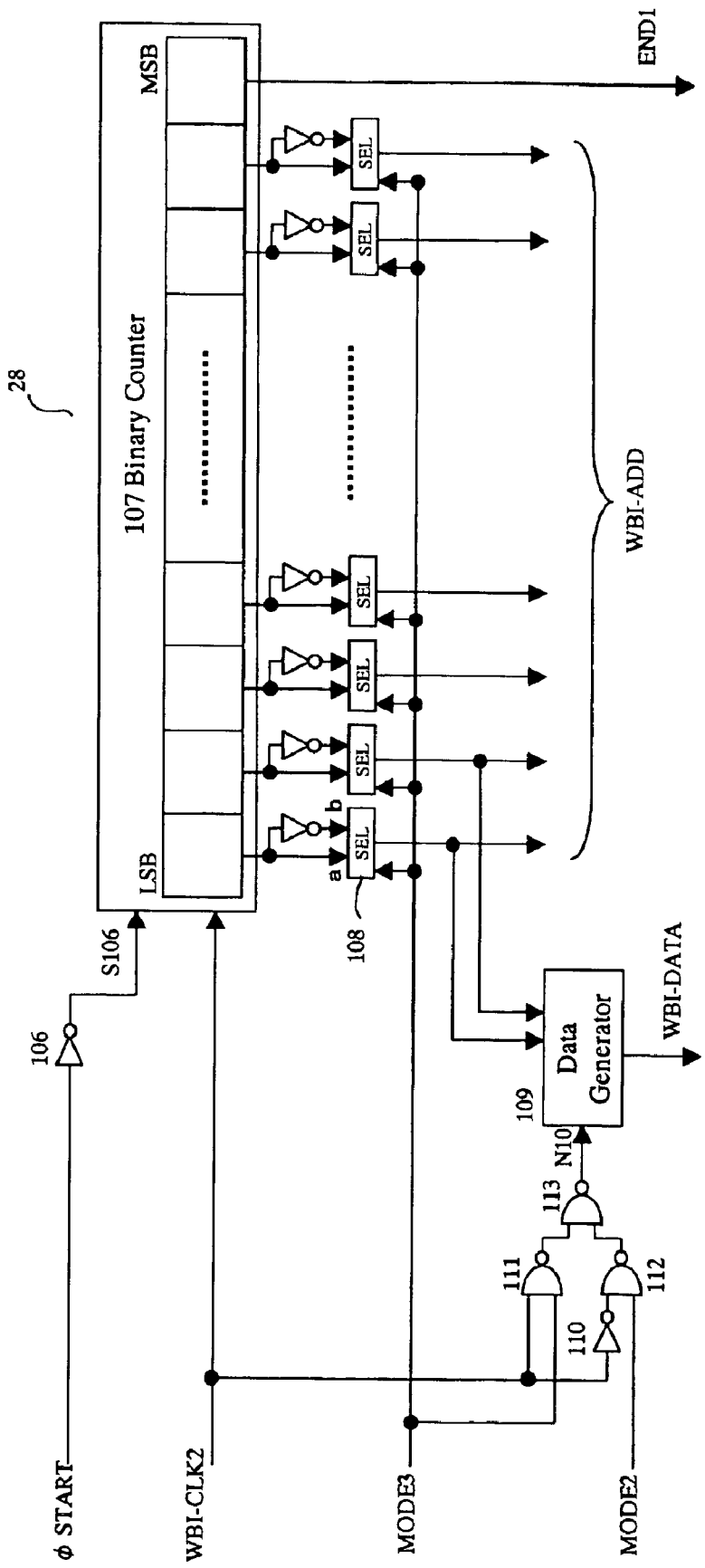
FIG. 14 is a circuit diagram of a test address/data generating circuit.

FIG. 14 is a circuit diagram of a test address/data generating circuit. Also, FIG. 15 is an operation timing chart of this test address/data generating circuit. In this WBI address/data generating circuit 28, when test operation mode start signal øSTART becomes H level, the reset signal S106 that is generated through inverter 106 becomes L level, causing operation of the binary counter 107 to be commenced. Specifically, binary counter 107 counts the second test clock WBI-CLK2 for test address and test data generation. In the first and fourth test modes MODE1, 4, this second test clock WBI-CLK2 is a clock obtained by frequency division to ¼ of the internal clock I-CLK and, in the case of the second and third test modes MODE2, 3, is a clock obtained by frequency division to ⅛ of the internal clock I-CLK.

Next, the count of this binary counter 107, or its complement (inverted value) is output as the test address WBI-ADD. The count value (a) and inverted value (b) of this binary counter 107 are selected by the third mode signal MODE3. That is, when the third mode signal MODE3 is H level, the test address WBI-ADD must be decremented, so the inverted value (b) is selected. In the case of the other modes MODE1, 2, 4, the third mode signal MODE3 is L level, and the uninverted value (a) is selected, the test address WBI-ADD being incremented.

When the most significant bit MSB of binary counter 107 becomes 1, first test operation mode end signal END1 becomes H level.

Also, the least significant two bits of binary counter 107 are supplied to data generating circuit 109, to be utilized as the address for test data WBI-DATA generation. Specifically, as shown in FIG. 6, for the test data WBI-DATA, a checkered pattern corresponding to the position of the memory cell is employed. To achieve this, the position of the memory cell in question must be recognized by the least significant two bits of the address.

Also, data generating circuit 109 must generate inverted test data WBI-DATA when in the second test mode MODE2 and in the third test mode MODE2. Moreover, in the first and fourth test modes MODE1, 4, it does not need to invert the test data. To achieve this, in the second mode MODE2, second test clock WBI-CLK2 inverted by inverter 110 is supplied to data generating circuit 109 from node N10 through NAND gates 112, 13. Also, in the case of the third mode MODE3, the second test clock WBI-CLK2 is supplied from node N10 to data generating circuit 109 through NAND gates 111, 113. Data generating circuit 109 generates checkered pattern test data WBI-DATA in accordance with node N10 and the least significant 2-bit test address. FIG. 15C shows an example of this test data. "0110" and "110011" are the combinations of test data in respect of the word line WL and line BL. In order to apply the maximum stress to the memory unit as in the burn-in test, in view of the physical arrangement of the memory cells, data should be written in a checkerboard pattern as shown in the example of WBI data of FIG. 15C.

It is to be understood that test commands WBI-CMD and test data WBI-DATA are generated so as to execute the four operating modes shown in FIG. 7 to FIG. 10 by the above test command generating circuit 26 and test address/data generating circuit 28.

Figure 16:
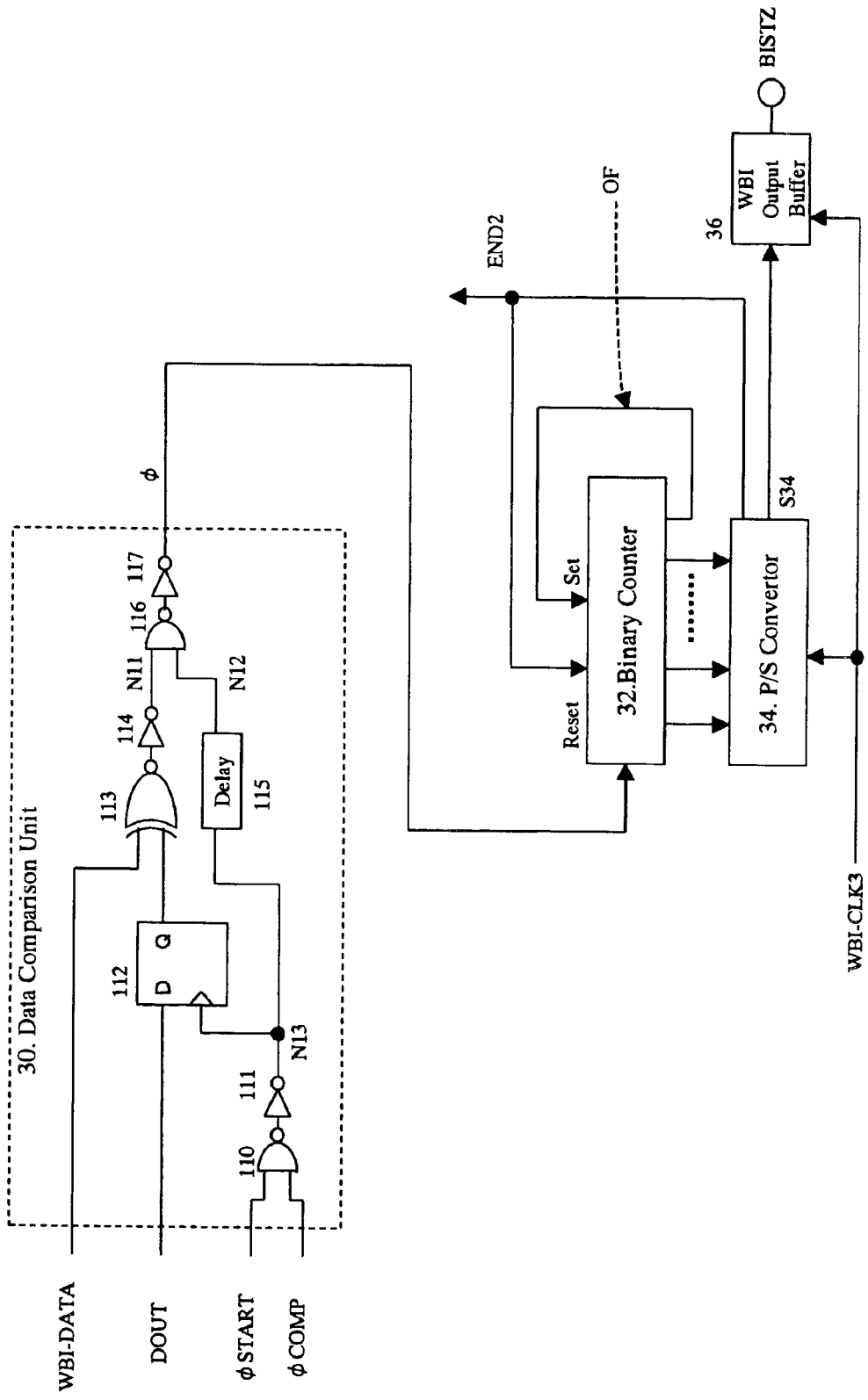
FIG. 16 is a layout diagram of a data comparison unit, counter, parallel/serial conversion unit, and test output buffer.
Figure 17:
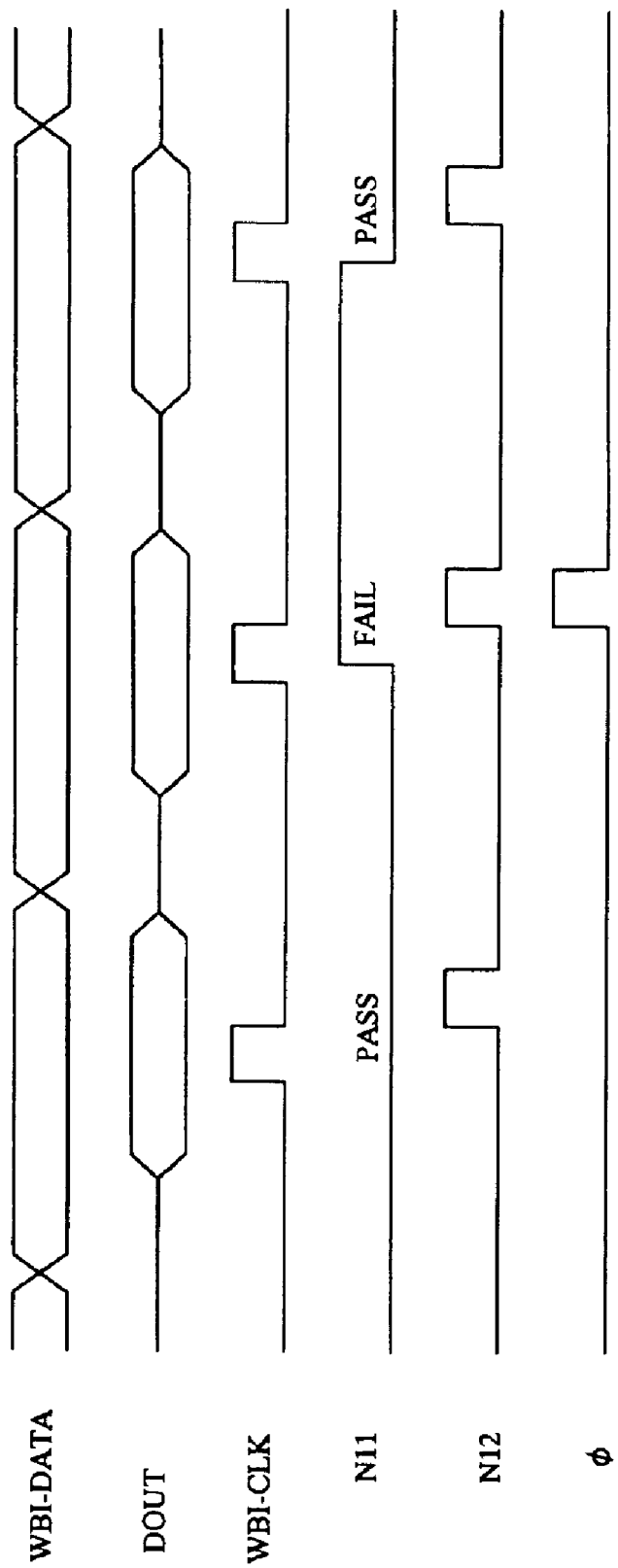
FIG. 17 is an operation timing chart of a data comparison unit.

FIG. 16 is a layout diagram of the data comparison unit, counter, parallel/serial conversion unit, and test output buffer. FIG. 17 is an operation timing chart of the data comparison unit. In data comparison unit 30 a comparison is effected in which the test data WBI-DATA and the data DOUT read from the memory cells are input to an exclusive OR circuit comprising gates 113 and 114. In this circuit example, the timing clock N13 for the comparison is generated from mode start signal øSTART and comparison timing signal øCOMP. However, instead of the comparison timing signal øCOMP, the data transfer signal whereby the read data is transferred from database DB to data input/output circuit DI/O in the memory circuit may be utilized.

If the result of the comparison by the exclusive OR circuit is non-coincidence, a fail signal øF is generated, and this is counted by binary counter 32 constituting failed bit counter 32. This fail signal øF is output synchronously with the control clock N12 delayed by delay circuit 115.

Binary counter 32 counts up the fail signal øF and, when it overflows, all the count values are forcibly set to 1 by means of overflow signal øF. Further counting up of the fail signal øF is then stopped. The count value of binary counter 32 is the number of times that failed bits are detected and constitutes the comparison result information of the self-test. Also, all of the count values being 1 constitutes the test result information that overflow has occurred. These count values are utilized in Weibull control in which the relationship between the burn-in stress time in the burn-in test and the number of failed bits is controlled.

In outputting these test results, all the bits of binary counter 32 are converted to serial data by the parallel/serial conversion circuit 34 and serially output from test output buffer 36 in synchronization with the third test clock WBI-CLK3, which is the output control clock. When serial output terminates, parallel/serial conversion circuit 34 generates a second end signal END2 indicating that the output mode operation has terminated.

The number of bits of failed bit counter 32 may be made equal to the maximum count value of the number of failures, corresponding to the maximum number of failed bits that can be rescued. This is because if this is exceeded, rescue by the redundant cells cannot be performed, so the device must be a failed device. Consequently, the test step itself may be discontinued once it has been ascertained that the maximum number of failures has been detected.

For example, in the case of the march pattern shown in FIG. 6, if the test is performed solely for the uninverted data, read data comparison is performed a total of three times. Consequently, the number of bits of failed bit counter 32 is chosen to be (maximum number of addresses that can be rescued by redundancy)×3. Binary counter 32 outputs an overflow signal øF when this maximum number of bits is exceeded. That is, failed bit counter 32 may have a bit number of at least three times the maximum number that can be rescued (in the case where an inverted pattern is used, at least six times).

Second Embodiment

Figure 18:
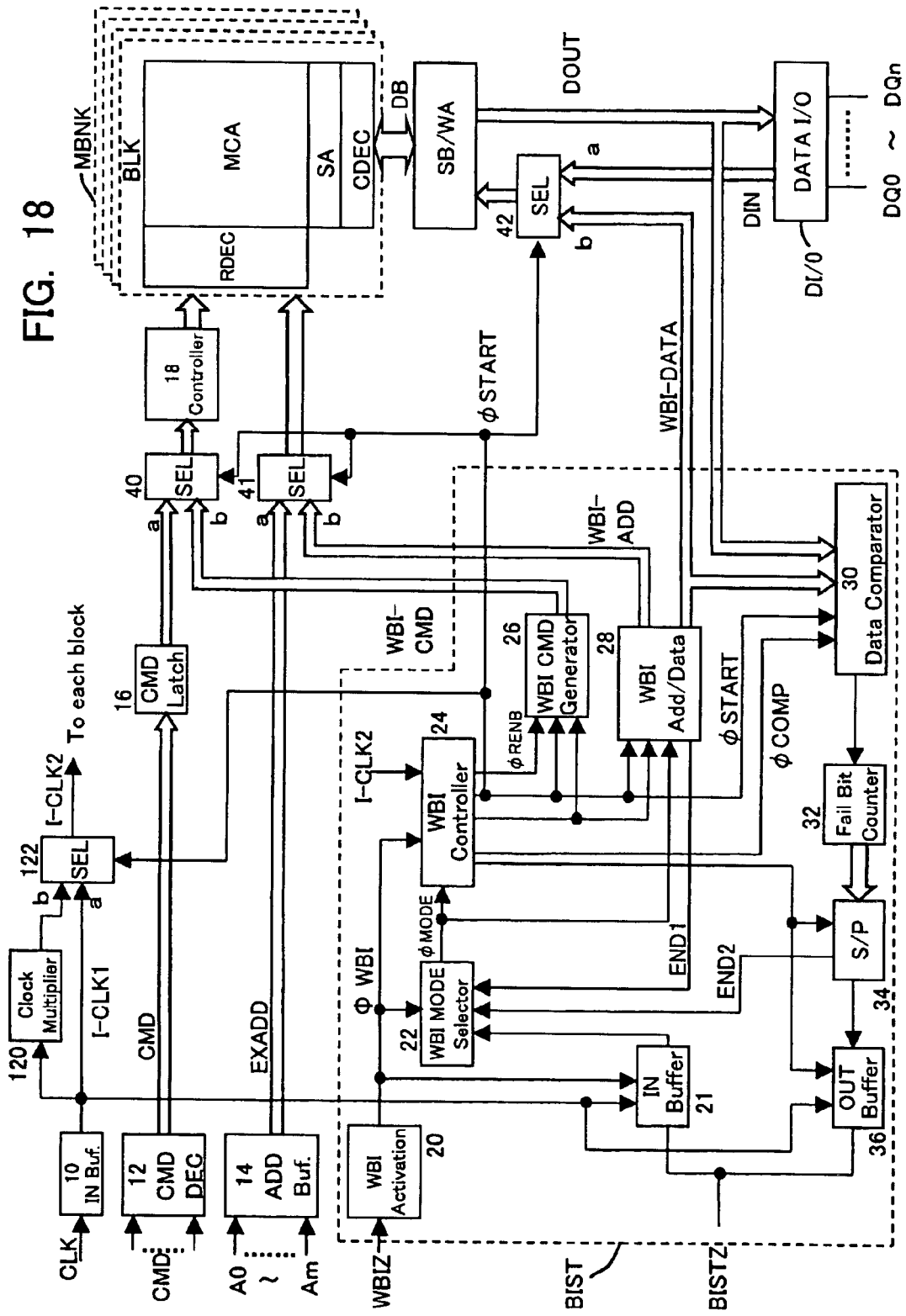
FIG. 18 is a layout diagram of a memory device according to a second embodiment.

FIG. 18 is a layout diagram of a memory device according to a second embodiment. In the second embodiment, a clock multiplier circuit 120 is provided on the output side of clock input buffer 10; in the self-test step, a clock CLK2 obtained by multiplying a comparatively slow clock I-CLK2 that is provided from outside is supplied to self-test circuit BIST and the interior of the device. Specifically, a clock CLK of for example 10 MHz is received from outside, and this is multiplied internally to 20 MHz, to operate the internal circuitry at double speed. Also, in this case, interface with the outside is effected by supplying an unmultiplied clock I-CLK 1 to the input/output circuits 21, 36. Also, multiplied clock I-CLK2 could be of three times the speed or four times the speed of external clock CLK.

The rest of the construction is the same as in the case of the first embodiment shown in FIG. 2. By the provision of a clock multiplier circuit 120 as described above, this self-test can be performed with an inexpensive tester of low clock frequency. For the clock multiplier circuit 120, for example a construction using a DLL circuit may be employed. Alternatively, another generally used circuit layout may be employed.

Third Embodiment

Figure 19:
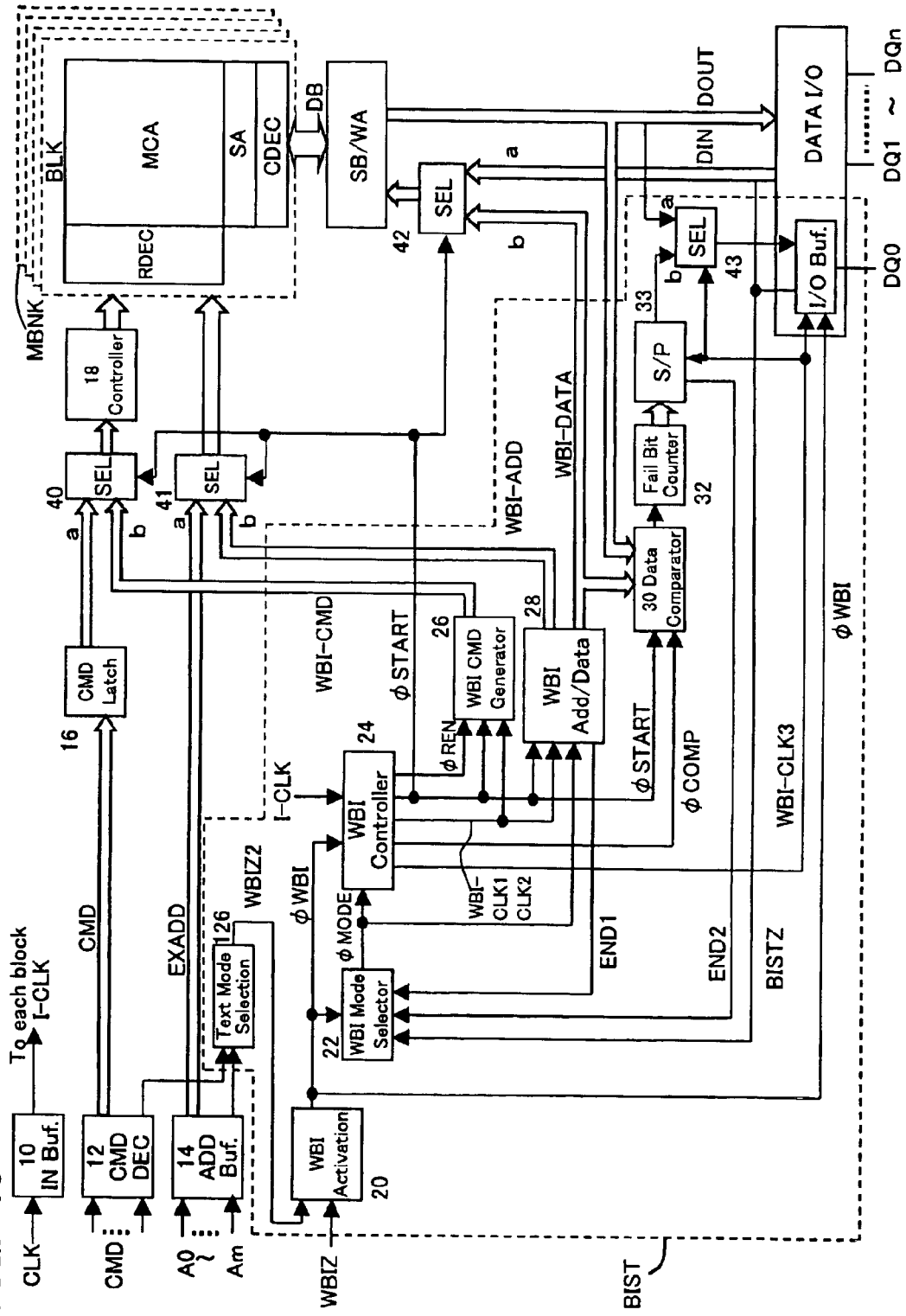
FIG. 19 is a layout diagram of a memory device incorporating a self-test circuit according to a third embodiment.

FIG. 19 is a layout diagram of a memory device incorporating a self-test circuit according to a third embodiment. The third embodiment is an example in which the testing can be carried out using the self-test circuit BIST also after assembly into the form of a package. To achieve this, in WBI activation circuit 20, in addition to the activation signal WBIZ in the wafer level burn-in test, a second activation signal WBIZ2 is additionally input from a test mode selection circuit 126 that selects test mode with a special command. When either of these activation signals WBIZ or WBIZ2 is in active condition, WBI activation circuit 20 detects that the self-test step is being performed and makes the internal WBI activation signal øWBI of H level.

Test mode selector circuit 126 generates the second activation signal WBIZ2 when a specific combination of external command input CMD and/or address input A0 to Am is input. Therefore, self-test circuit BIST is activated in response to the activation signal WBIZ in the wafer condition in the same way as in the first embodiment and, after assembly, is activated in response to a specific combination of command input CMD and address signal.

An example circuit of the WBI activation circuit corresponding to the third embodiment is shown in the bottom left-hand part of FIG. 3. The internal WBI activation signal øWBI becomes H level in response to either of the two activation signals WBIZ, WBIZ2 becoming H level.

In the third embodiment, in addition, there is provided a selector 43 whereby the output of parallel/serial conversion circuit 33 is output to the outside sharing the I/O buffer of the memory device. Consequently, the input/output terminal DQO, in the ordinary operation condition, functions as an input/output terminal, and, in the self-test step, functions as an output terminal that outputs the test result information constituted by the value of counter 32. In this way, in the self-test step utilizing the self-test circuit BIST, the activation signal terminal WBIZ is only utilized in a special way in the wafer level burn-in test. The number of probes onto the wafer can therefore be further restricted.

Fourth Embodiment

Figure 20:
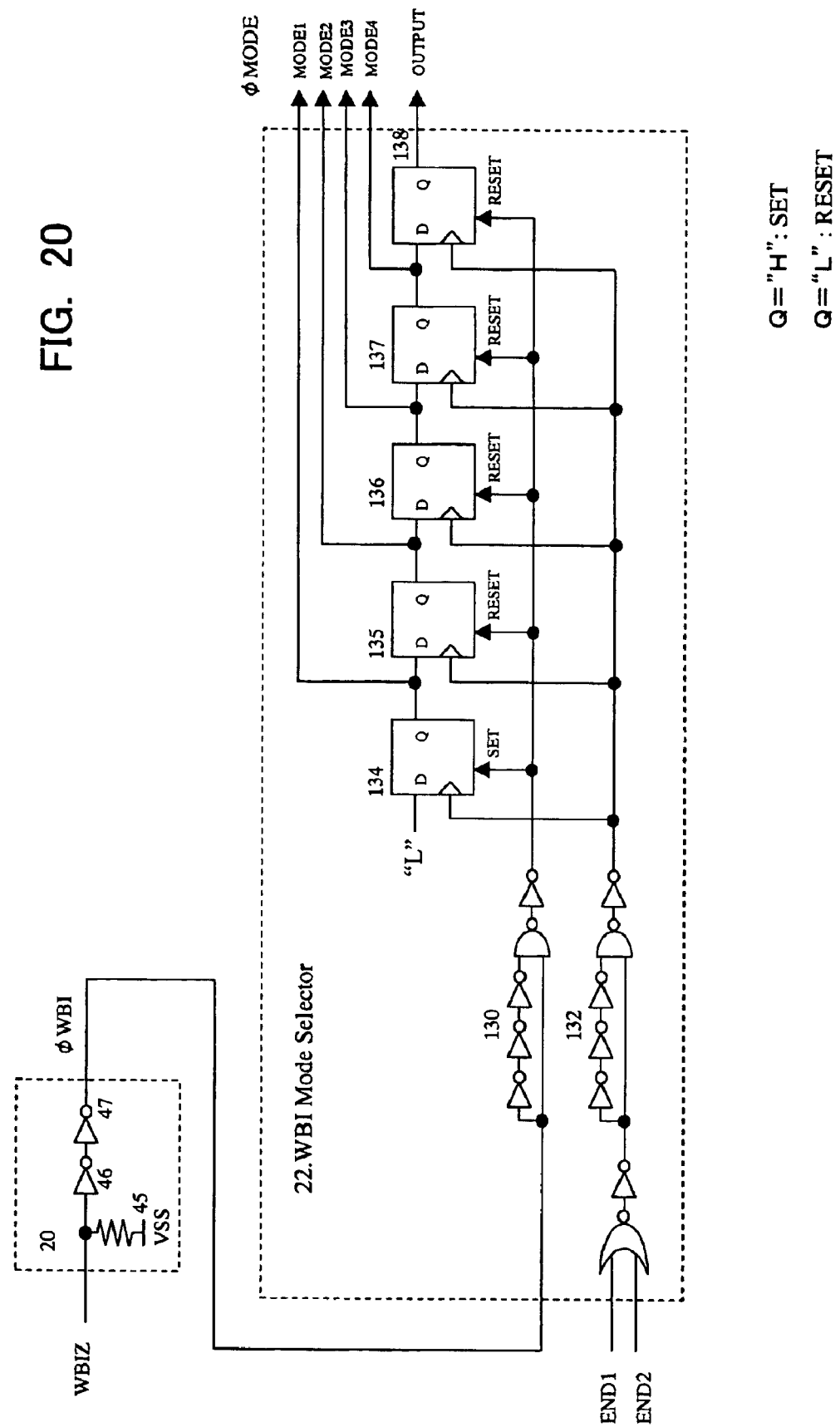
FIG. 20 is a layout diagram of a WBI activation circuit and WBI mode selection circuit according to a fourth embodiment.

FIG. 20 is a layout diagram of a WBI activation circuit and WBI mode selector circuit according to a fourth embodiment. The WBI mode selector circuit in the fourth embodiment is a modification of that of FIG. 3. The WBI mode selector circuit 22 shown in FIG. 20 is provided with flip-flops 134 to 138. These flip-flops input as set/reset signal the pulse generated by pulse generating circuit 130 at the rising edge of WBI activation signal øWBI, and input as data input clock the pulse generated by pulse generating circuit 132 at the rising edge of one or other of the operation mode termination signals END1, 2.

Consequently, when the WBI activation signal øWBI becomes H level, the flip-flops 134 to 138 sequentially automatically generate test mode signals MODE1→MODE2→MODE3→MODE4→OUTPUT. By utilizing this WBI mode selector circuit, input of the mode signal BISTZ as shown in FIG. 2 or 3 is unnecessary, so the self-test can be executed in an even simpler fashion.

Fifth Embodiment

FIG. 21 is a view showing an example of a test result information output unit according to a fifth embodiment. Two examples are shown in FIG. 21. As output unit, self-test circuit BIST comprises a comparison result accumulation circuit that accumulates the data comparison result information in some form, and a test output circuit that outputs this comparison result information. In the first embodiment shown in FIG. 2, there are provided a fail bit counter 32, parallel/serial conversion circuit 34, and test output buffer 36, and the count value of counter 32 or the information of its overflow condition is output.

Figure 21A:
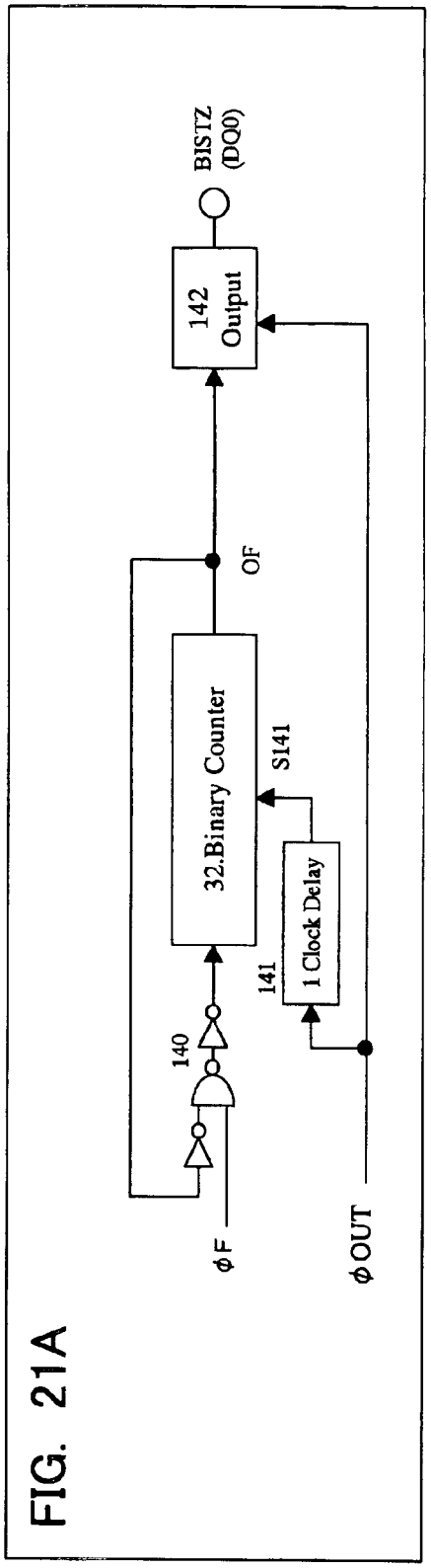
FIGS. 21A and 21B is a view showing an example of an output unit for test result information according to a fifth embodiment.

The output unit of FIG. 21A comprises a binary counter 32 that is supplied, as fail signal øF, with comparison result information indicating that the result of the data comparison was non-coincidence, and that accumulates the number of times this occurs; and an output circuit 142 that outputs an overflow signal øF generated when this binary counter 32 overflows. Consequently, only information as to whether or not overflow occurred is output. Consequently, this output unit can be utilized when it is sufficient to determine whether the chip is a chip that can be rescued by redundant cells of the memory circuit or a chip that cannot be thus rescued.

In the example of FIG. 21A, the overflow signal øF is initially L level. When fail signals øF are generated in excess of the number that can be accommodated by redundancy, the overflow signal øF becomes H level, and input of fail signals øF is stopped by circuit 140. If, thereafter, an output control signal øOUT is input, output circuit 142 outputs the overflow signal øF. The binary counter 32 is set by generation of the reset signal S141 consisting of the output control signal øOUT delayed by one clock pulse by delay circuit 141.

Figure 21B:
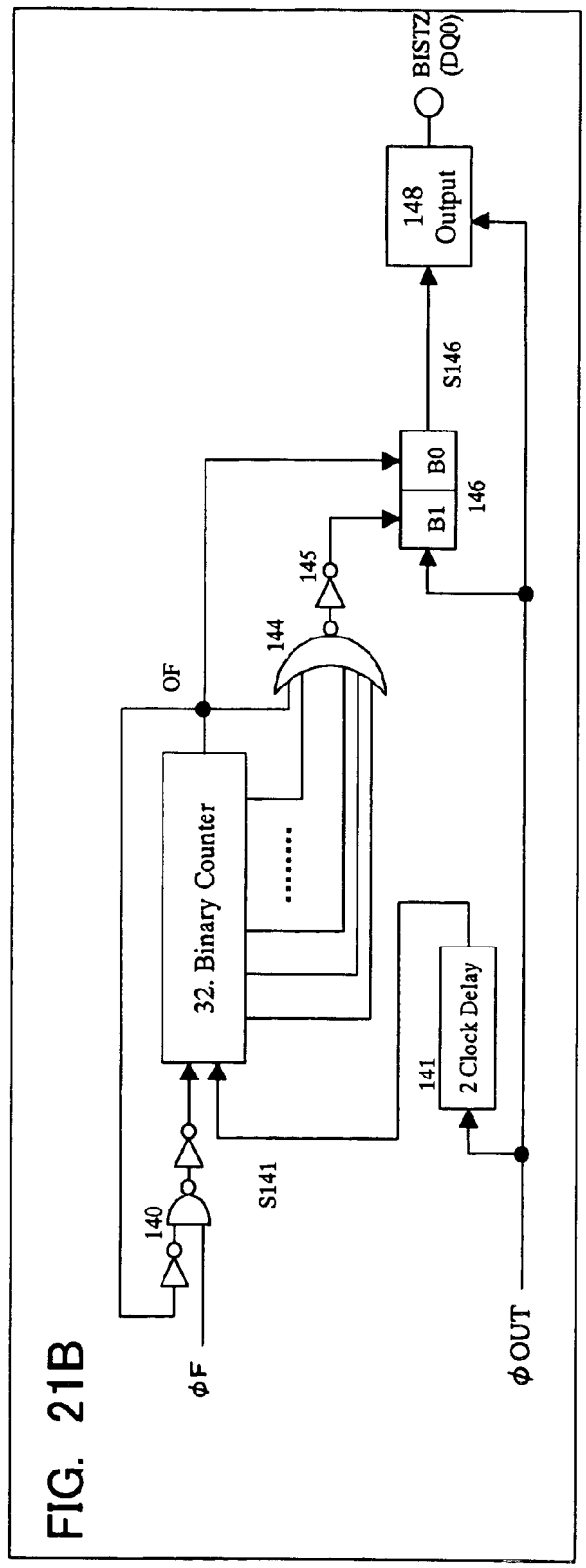

The example output unit of FIG. 21B is of a construction that outputs as comparison result information three types of identification information, namely, passed chip in which redundant cells do not need to be used, chip that can be rescued by means of the redundant cells, and chip that cannot be rescued by the redundant cells. Even if the fail signal øF is generated only once, first bit B1 of register 146 is made H level through NOR gate 144 and inverter 145. Also, when binary counter 32 overflows, the second bit B0 of register 146 becomes H level. The first bit B1 therefore provides the information as to whether the chip is a passed chip with no defect or whether it is a chip that does have a defect but can be rescued by the means of the redundant cells. The second bit B2 provides the information as to whether the chip is or is not a defective chip that cannot be rescued by the redundant cells. Output circuit 148 sequentially serially outputs this test result information of the two bits B0, B1 of the register 146 for example in response to output control signal AOUT. If the output is (B0, B1)=(0, 0), it is concluded that the chip is a passed chip, if it is (0, 1), it is concluded that the chip is a chip that is capable of being rescued by redundancy, and if it is (1, 1) it is concluded that the chip is incapable of redundancy.

The output circuit shown in FIG. 21 cannot output the number of failed bits as comparison result information, but its circuit layout is correspondingly simplified. Also, it is not necessarily essential for the third test clock WBI-CLK3 to be employed for the output control circuit; any sort of pulse signal can be employed.

Sixth Embodiment

Figure 22:
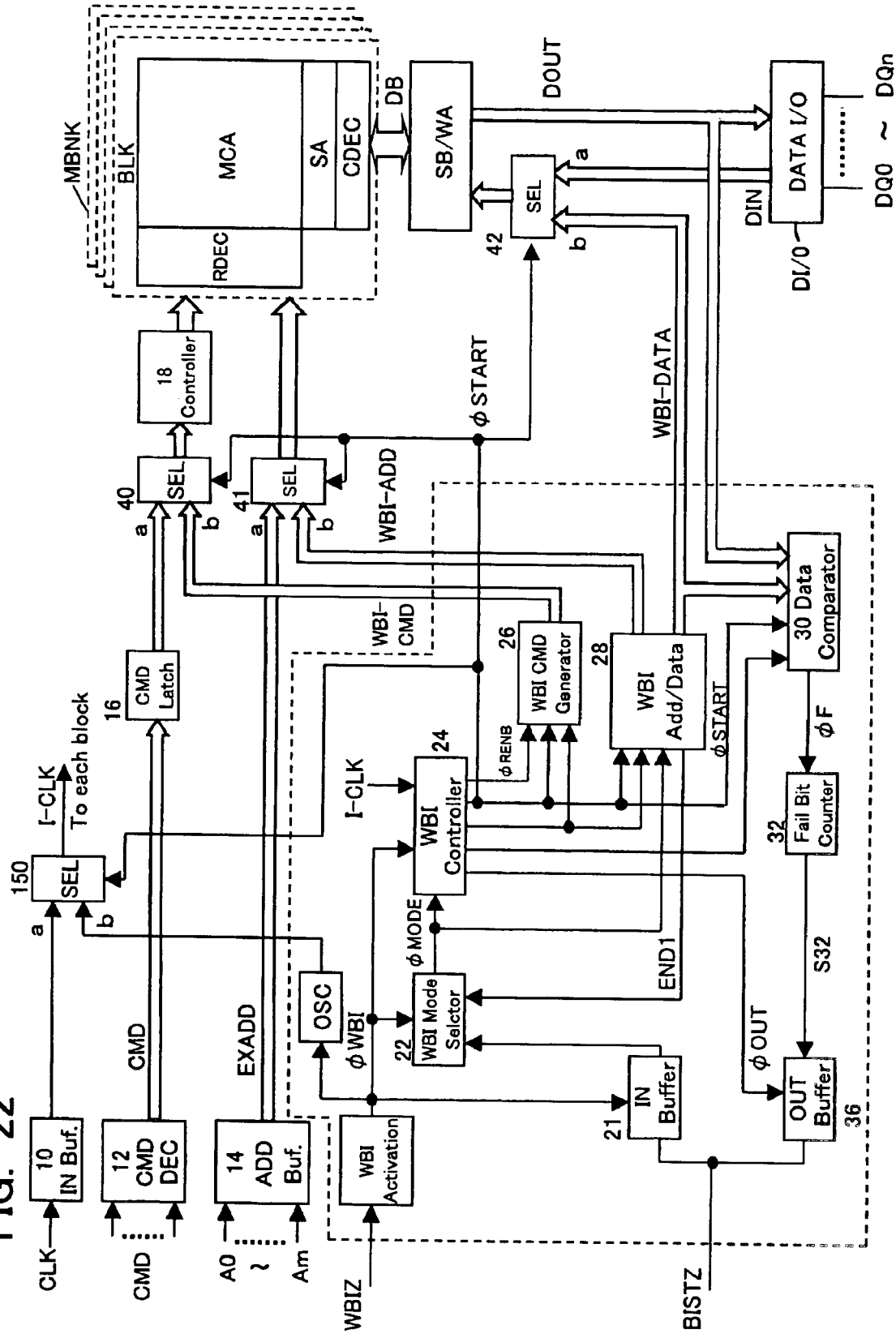
FIG. 22 is a layout diagram of a memory device according to a sixth embodiment.

FIG. 22 is a layout diagram of a memory device according to a sixth embodiment. If the WBI activation circuit and WBI mode selector circuit (FIG. 20) in the fourth embodiment and the data output circuit (FIG. 21) in the fifth embodiment are employed, the interface with the outside does not require a clock. Accordingly, in the sixth embodiment, utilizing these circuits, there is incorporated, in addition, an oscillator OSC that is activated during self-test operation. In addition, there is provided a selector 150 that is changed over to the clock generated by oscillator OSC from the external clock CLK during self-test operation.

In the sixth embodiment, when activation signal WBIZ is applied, oscillator OSC starts generation of the clock signal, and supplies this through selector 150 to the memory circuit and/or other circuits. Also, WBI mode selector circuit 22 generates sequential mode signal øMODE, and, in accordance therewith, the tests of the respective modes are executed, and the test results are output from input/output terminal BISTZ for self-test. Consequently, in this case, the test costs can be further reduced since no external clock signal is necessary.

In the foregoing embodiments, the self-test circuit was described under the assumption that it would be utilized in a wafer level burn-in test. However, this self-test circuit could also be utilized in a burn-in test at package level after assembly. In the case of both tests, the presence of failed bits can be detected by the memory device itself performing an internal test simply by supplying an external activation signal and/or mode input signal etc.

In addition, the test operation commands of the above embodiments were for the case of SDRAM or FCRAM; in the case of memory devices of other types, the operation commands employed for these are generated as test operation commands.

Seventh Embodiment

In the first, second, third and six embodiments described with reference to FIGS. 2, 18, 19, 22, selector 40 for performing changeover between the external command CMD and a test operation command WBI-CMD, selector 41 for performing changeover between the external address EXADD and test address WBI-ADD, and selector 42 for performing changeover between the write input data DIN and test data WBI-DATA are provided between the respective input circuit and the memory bank MBNK.

The burn-in test is a test which is conducted in order to exclude devices having initial defects, by applying stress to the device. It is therefore desirable that as many circuits as possible should be made to operate in the burn-in test. Consequently, so far as the address, command and data input circuits are concerned, the number of circuits that are made to operate under stress during the burn-in test can be made larger by adopting a construction in which the test address WBI-ADD, test operating command WBI-CMD and test data WBI-DATA generated by the self-test circuit BIST are input from as close as possible to the external input terminal.

Consequently, in the seventh embodiment, the selectors are arranged close to the external input terminal. However, if such a selector circuit were directly connected to the input terminal, there would be adverse effects such as an increase in input terminal capacitance. Accordingly, the selector is provided in an input circuit. In a specific example, the selector is provided between the input buffer and latch circuit of an input circuit.

Figure 23:
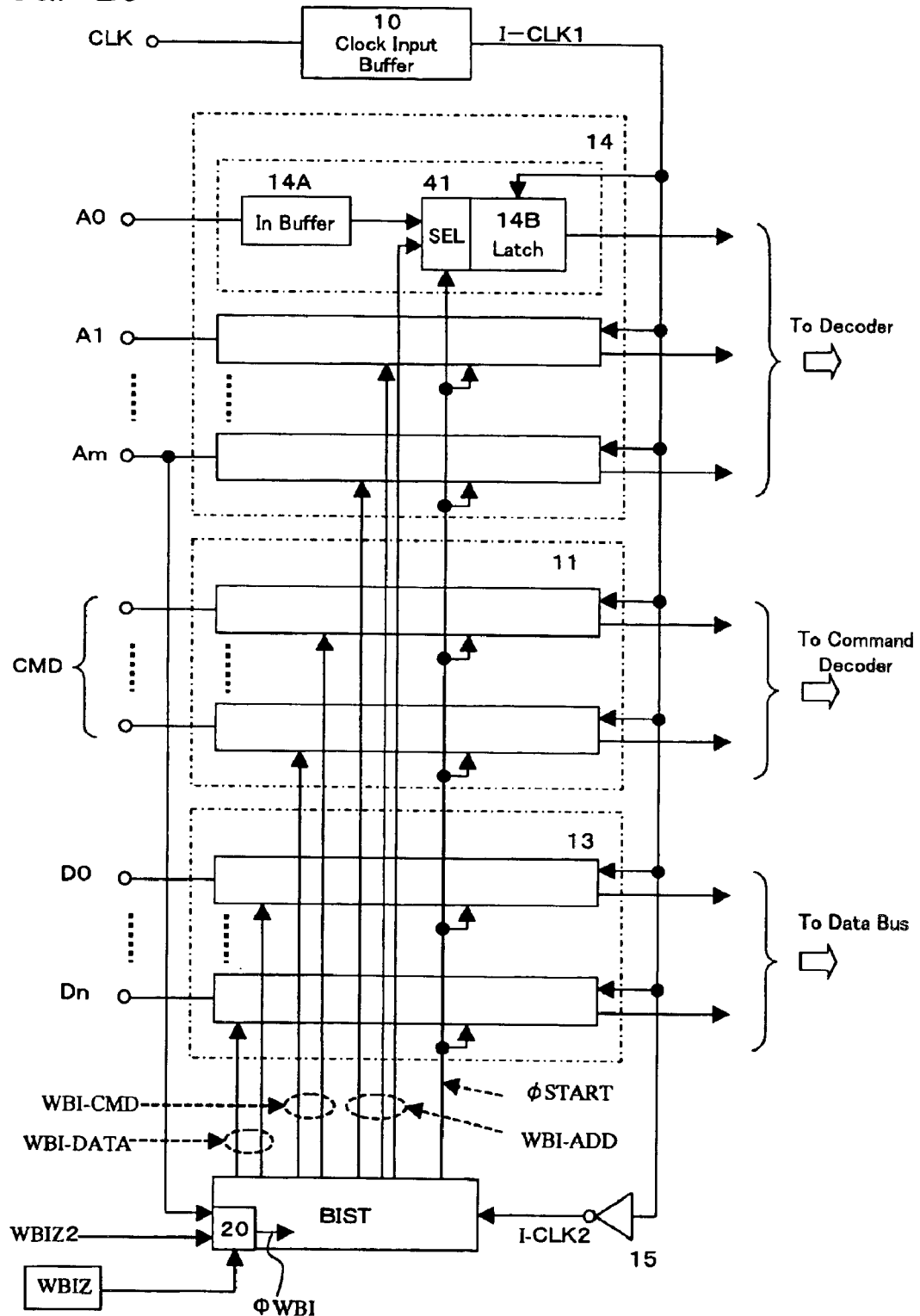
FIG. 23 is a view illustrating the layout of an input circuit according to a seventh embodiment.

FIG. 23 is a view showing the construction of an input circuit according to a seventh embodiment. Describing the construction of FIG. 23 by comparison with the third embodiment illustrated in FIG. 19, the address input circuit 14 constituting the address buffer comprises an input buffer 14A connected to an external terminal and that inputs signals from outside and subjects these to waveform shaping and/or voltage level conversion, and a latch circuit 14B that latches the output of input buffer 14A in synchronization with the rising edge of clock I-CLK. A selector 41 that effects changeover in response to a start signal øSTART generated by the self-test circuit BIST is provided between input buffer 14A and latch circuit 14B. Although not shown in FIG. 23, the command input circuit 11 and data input circuit 13 in front of the command decoder 12 likewise have a selector provided in front of the latch circuit.

Taking the example of address input circuit 14, input buffer 14A is constituted for example by a current mirror circuit and is provided with an amplification function and/or a function of level conversion to an internal power source. Also, during normal operation, the latch circuit latches the externally supplied addresses A0 to Am in synchronization with the rising edge of clock I-CLK and, during self-test, latches the test address WBI-ADD from self-test circuit BIST in synchronization with the rising edge of clock I-CLK. Command input circuit 11 and data input circuit 13 also operate in the same way.

By adopting such a construction, during self-test, the operation of the internal circuitry downstream of latch circuit 14B can be made the subject of a stress test, making it possible to perform a more accurate burn-in test.

However, if selector circuits are provided in this way in the vicinity of the input terminal, the following two problems arise. Firstly, since there is a latch circuit that effects latching in synchronization with the clock I-CLK downstream of the selector circuit, the timing with which the test address WBI-ADD, test operation command WBI-CMD, and test data WBI-DATA generated by the self-test circuit BIST are generated must be matched with the timing of the latch of the input circuit. Secondly, when there is provided a function of performing a burn-in test by activating the self-test circuit BIST by an external command after assembly into the form of a package described in the third embodiment of FIG. 23, since, in normal operation, if self-test mode is accidentally entered, the selector circuit is changed over to the test side, it becomes impossible to input a self-test cancellation command from the external command terminal.

The first problem described above can be solved by providing an inverter 15 that generates a second internal clock I-CLK2 obtained by inverting the internal clock I-CLK, as shown in FIG. 23. The second internal clock ICLK2 is advanced in phase by 180° with respect to the internal clock I-CLK that controls the latch timing. Consequently, the self-test circuit BIST can generate test address WBI-ADD, test operation command WBI-CMD and test data WBI-DATA at the rising edge of the second internal clock I-CLK2 and the latch circuit 14B can latch the signal that is changed over by the selector in synchronization with the rising edge of the subsequent internal clock I-CLK.

Figure 24:
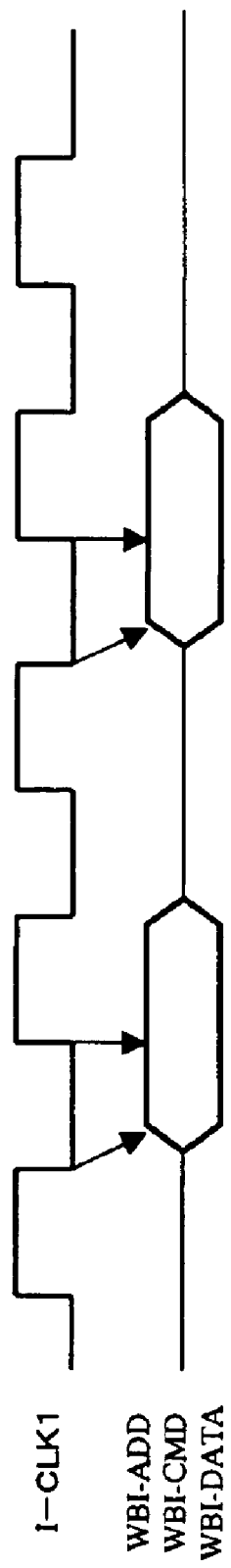
FIG. 24 is a timing chart illustrating the relationship between generation and input of test addresses.

FIG. 24 is a timing chart illustrating the relation of generation and input of the test address etc. The device gets the external signals in synchronization with the clock I-CLK, so input signals such as the test address etc must be supplied to the internal circuitry with a timing whereby the set-up time and hold time are guaranteed with respect to this internal clock I-CLK. In order to achieve this, an inverted clock I-CLK2 is generated by inverter 15, and self-test circuit BIST is arranged to operate in synchronization with the down edge of the internal clock I-CLK. That is, since self-test circuit BIST generates and supplies the test address etc in synchronization with the down edge of the internal clock I-CLK, latch circuit 14B can latch the test address etc in synchronization with the up edge of the next internal clock I-CLK.

In this example, the second internal clock I-CLK2 was an inverted clock obtained from internal clock I-CLK, but it would be possible to use a clock which was obtained by advancing internal clock I-CLK by a prescribed time as the second internal clock I-CLK2. However, if an inverted clock is employed, it suffices merely to provide an inverter 15 and this is thus simplest in circuit terms.

Regarding the second problem, when selector circuit 41 etc is changed over to the self-test side by putting the internal circuitry in self-test mode in response to input of a self-test entry command as an external command, it is necessary to arrange that the self-test cancellation command can be input as an external command. To achieve this, the self-test circuit BIST temporarily makes the start signal øSTART that changes over selector circuit 41 become L level in response to one or other of the input terminals or a combination of input terminals. As a result, the selector circuit 41 is changed over to the external terminal side by the L level of the start signal øSTART, making it possible to input a prescribed self-test cancellation command from outside.

This second problem raises when the self-test circuit BIST is utilized in a burn-in test after assembly into a package. Even if a self-test entry command is accidentally input during normal operation, by making it possible to input a self-test cancellation command at least from outside by changing over the selector circuit by means of one or other of the input terminals or a combination of input terminals, the second problem can be solved.

In the example illustrated in FIG. 23, external address Am is utilized as the self-test cancellation terminal. In the self-test circuit BIST, as shown also in FIG. 19, there is provided a WBI activation circuit 20 that generates a WBI activation signal øWBI in response to one or other of activation signal WBIZ and second WBIZ2. As shown in FIG. 3, WBI activation circuit 20 puts the WBI activation signal øWBI in H level test mode in response to the H level activation signal WBIZ that is input from a special external terminal WBIZ employed in the wafer level burn-in test. Also, the activation signal øWBI becomes L level when the external terminal WBIZ becomes open, with the result that the WBI activation signal øWBI becomes the L level normal mode.

In contrast, after the assembly step, the second activation signal WBIZ2 is made H level by an entry command from outside, so, when the external address Am becomes H level, the WBI activation signal øWBI becomes H level, and self-test mode is entered. Then, when the external address Am becomes L level, the WBI activation signal øWBI temporarily becomes L level, the start signal øSTART becomes L level, and a condition in which signal input from outside is possible is produced. The normal mode can then be returned to by the second activation signal WBIZ2 becoming L level in response to input of a self-test cancellation command from outside.

Address terminal Am may be a terminal that is not required for the command for entering self-test mode. The terminal for temporarily canceling self-test mode may therefore be a command terminal or DQ terminal. Thus, in self-test mode, the self-test circuit BIST is operated by making address Am="H", but, by making address Am="L", the self-test circuit BIST is disabled so that address and command can be input from outside.

Figure 25:
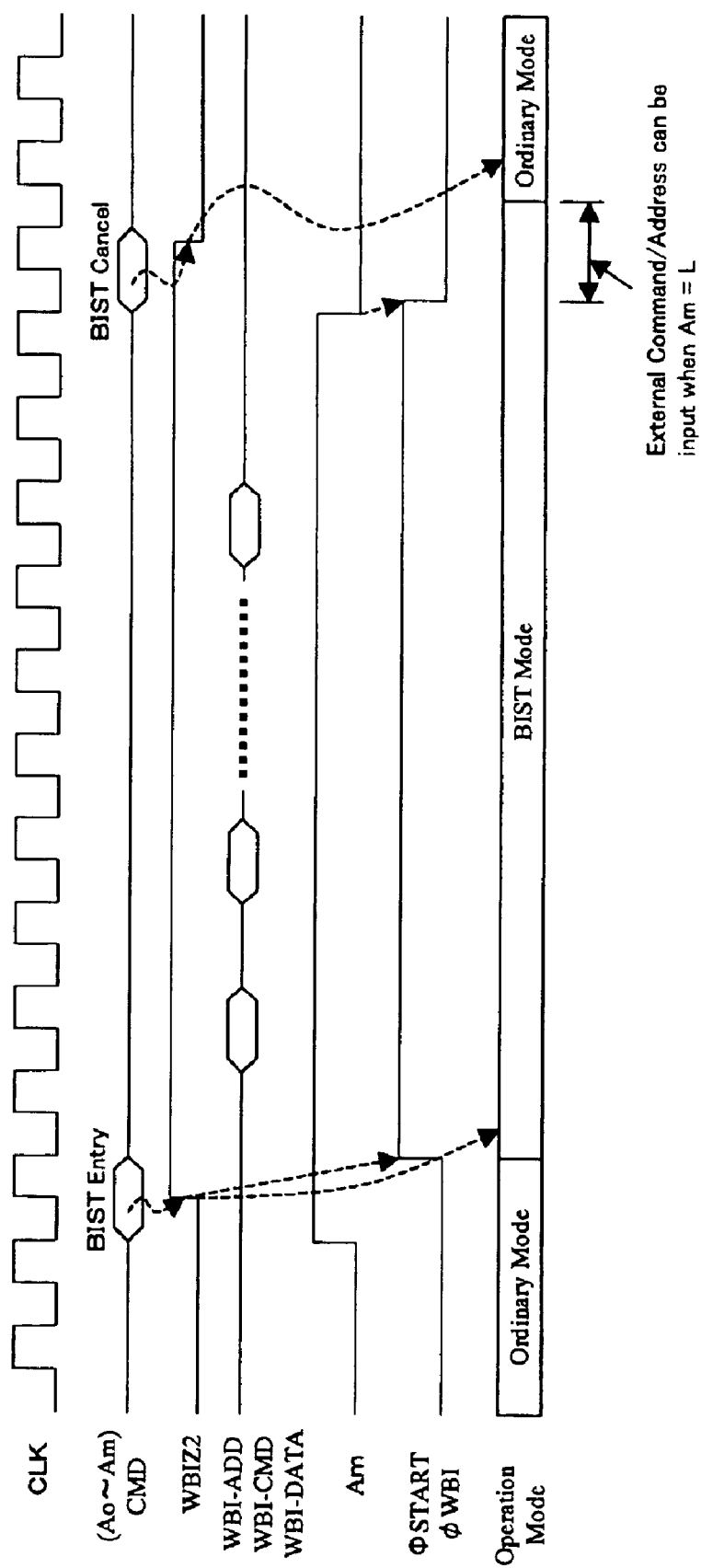
FIG. 25 is a timing chart illustrating entry and cancellation of self-test mode after assembly.
Figure 26:
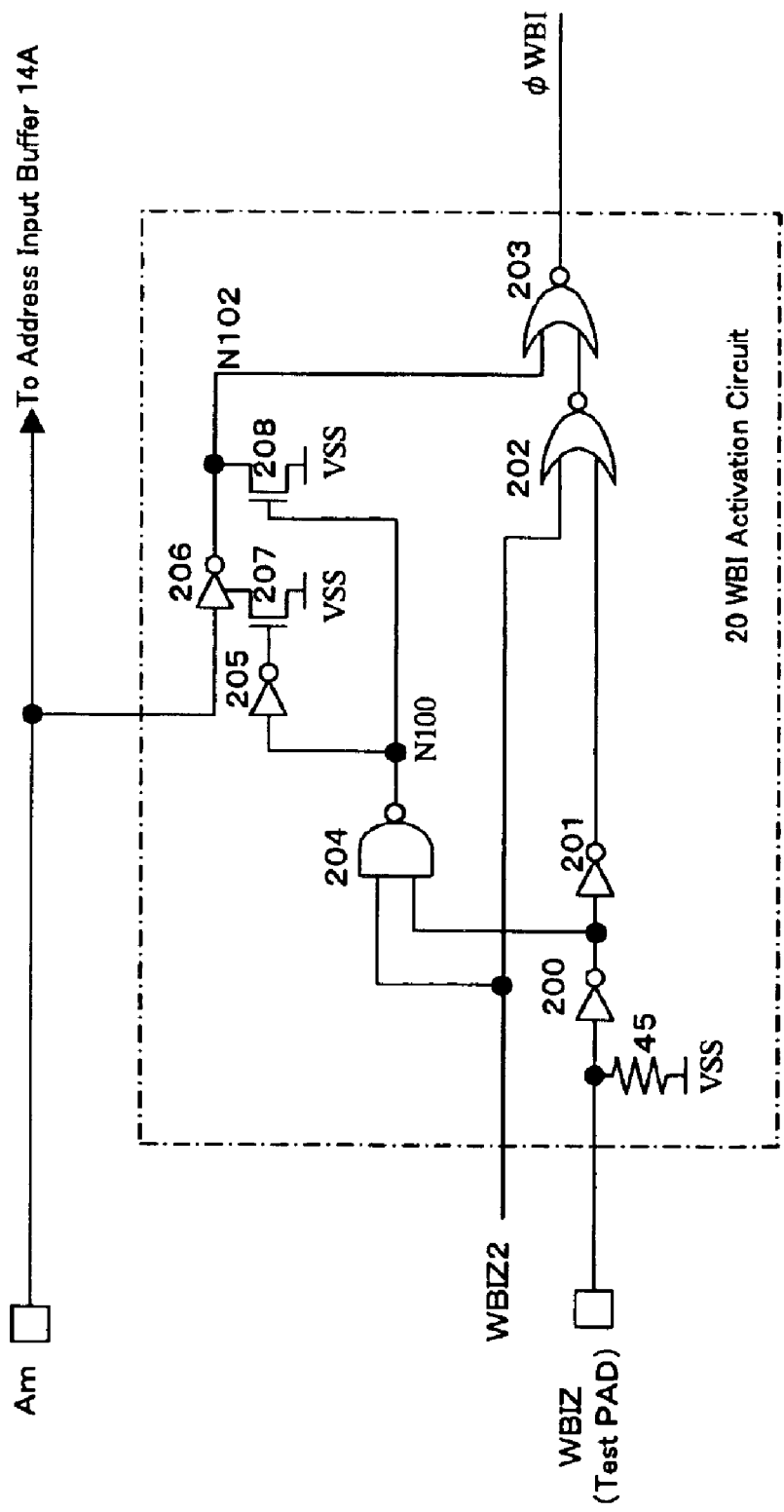
FIG. 26 is a circuit diagram of a WBI activation circuit according to the seventh embodiment.

FIG. 25 is a timing chart to illustrating entry and cancellation of self-test mode after assembly. Also, FIG. 26 is a circuit diagram of the WBI activation circuit 20 for achieving this. Entry and cancellation of self-test mode in the wafer condition and entry and cancellation of self-test mode after assembly will be described with reference to these Figures.

In the wafer condition, when an H level activation signal WBIZ is input from test terminal WBIZ, the output of inverter 200 becomes L level and the output of inverter 201 becomes H level. The output N100 of NAND gate 204 thereby becomes H level, so causing transistor 208 to become conductive while the transistor 207 becomes non-conductive, and node N102 to be maintained at L level irrespective of the address Am. Consequently, both inputs of NOR gate 203 become L level, and the WBI activation signal øWBI becomes H level, causing the self-test mode to be entered. Consequently, the signal of address Am is ignored. Thus, when the signal of test terminal WBIZ is made L level, the WBI activation signal øWBI becomes L level, and the self-test mode is canceled. Thus, in the wafer condition, entry and cancellation of the self-test mode are performed solely by means of test terminal WBIZ.

Next, after assembly, when an entry command is input from the external address terminal or command terminal, the second activation signal WBIZ2 becomes H level. At this point, the test terminal WBIZ is in the open condition and is fixed at L level. Consequently, the H level output of inverter 200 and the second activation signal WBIZ2 are input to NAND gate 204 thereby making node N100 L level, as a result of which transistor 207 is maintained conductive while transistor 208 is maintained non-conductive, and the inverted signal of address Am is output to node N102. If Am is H level, node N102 becomes L level, and the output of NOR gate 203 becomes H level. That is, the WBI activation signal øWBI is controlled to H level by address Am, causing self-test mode to be entered.

In order to cancel the self-test mode, address Am is made L level. Node N102 thereby becomes H level, and WBI activation signal øWBI becomes L level. In response to this, self-test circuit BIST makes start signal øSTART L level, and changes over the selector circuit to the input terminal side. A condition in which an external command can be input is thereby produced. Thereupon, when a self-test cancel command is input from outside, the second activation signal WBIZ2 is made L level by test mode selection circuit 126, producing the normal mode. Thereafter, the input of address Am is ignored, and the normal mode is maintained.

Although, in the above example, a single address terminal Am delivers input to self-test circuit BIST as a self-test mode halt signal, it would be possible to create a self-test mode halt signal by decoding the signals of a plurality of address terminals and/or command terminals. If it is arranged for this halt signal to be generated by a combination of inputs of self-test mode cancellation commands, when the self-test mode cancellation commands are input from outside, the start signal øSTART becomes L level and the cancellation commands are input to the device, causing the self test mode to be canceled.

Also, when the present invention is applied to DRAMs etc, in order to achieve automatic cancellation when this self-test mode is entered by mistake in the normal use condition, the "pre-charge" command in which a selected memory bank is pre-charged and/or the "pre-charge all" command in which all the memory banks are pre-charged could be used as a self-test mode cancellation command. As a result, an accidentally entered self-test mode can be canceled by a pre-charge command, thereby making it possible to shift to the next operating cycle in a suitable manner.

Figure 27:
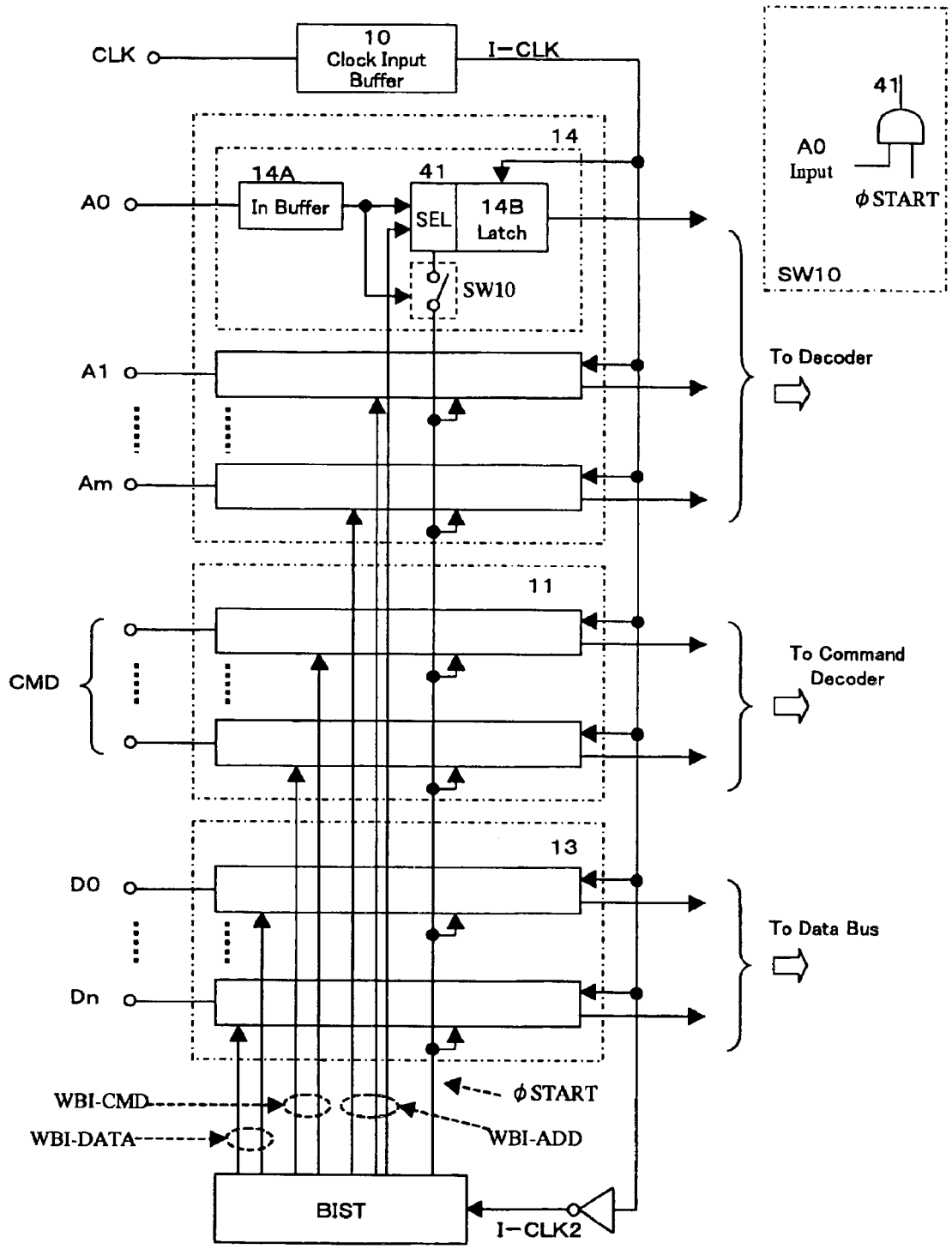
FIG. 27 is a layout diagram of a further input circuit according to the seventh embodiment.
Figure 28:
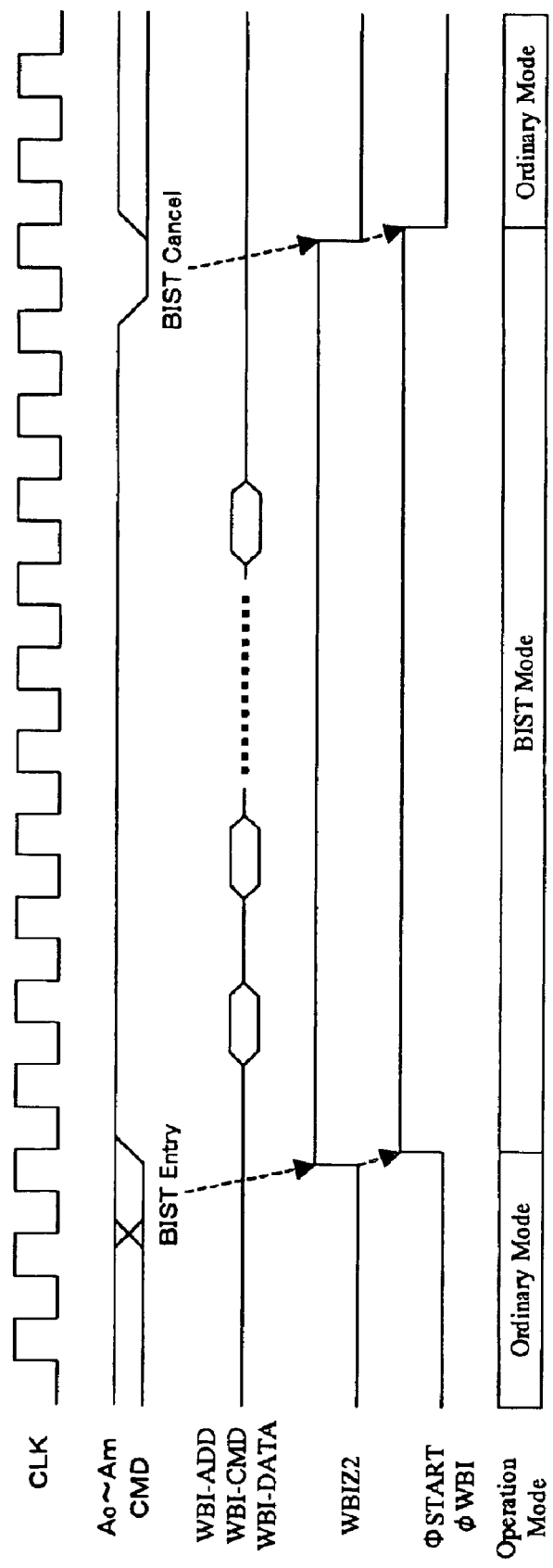
FIG. 28 is a timing chart illustrating entry and cancellation of self-test mode after assembly in the case of FIG. 27.

FIG. 27 is a further input circuit layout diagram according to a seventh embodiment. FIG. 28 is a timing chart illustrating entry and cancellation of self-test mode after assembly in the case of FIG. 27. In this example, the start signal øSTART is input through a switch SW10 to a selector 41 of the input circuit. Also, this switch SW10 is controlled by an input signal A0. When address A0 is maintained at H level, the start signal øSTART continues to be supplied to selector 41; when address A0 is made L level, the switch SW10 is turned off, causing an L level start signal to be supplied to selector 41, as a result of which it goes into a condition in which an external command can be input.

For example, switch SW10 may be constituted by an AND gate as shown in FIG. 27. After self-test mode is entered, if H level is applied to input terminal A0, the start signal øSTART continues to be input to selector 41, with the result that the signal generated by self-test circuit BIST such as a test address is input by the input circuit. If L level is applied to input terminal A0, the start signal øSTART is cut off, and an input signal A0 from outside is input to selector 41.

This switch SW10 is provided at a terminal that inputs the self-test mode cancellation command. And the self-test mode cancellation command comprises such a terminal L level. In this way, in this self-test mode, during activation of the self-test circuit BIST, these terminals are made H level, but, when the self-test mode is to be canceled, as a cancellation command, these terminals are made L level, causing the self-test mode cancellation command to be input to the devices thereby canceling the self-test mode.

Switches SW10 need not be provided at all terminals. Also, the switches SW10 of a plurality of terminals may be controlled by the input signal of a single terminal. Also, when, as described above, this embodiment is applied to a DRAM etc, in order to cancel an erroneously entered self-test mode in the normal use condition, the pre-charge command may be used as a self-test mode cancellation command.

In this embodiment, when a self-test mode cancellation command is input, switch SW10 is turned off by L level of the prescribed terminal (in the example of FIG. 27, address A0) contained in this command, and all of the selectors with which the switch is provided are changed over to the external input terminal side. As a result, this cancellation command is input, test mode selector circuit 126 makes the second activation signal WBIZ2 L level, and the self-test mode of self-test circuit BIST is canceled. As a result, start signal øSTART is made L level, producing the normal mode.

Also, when self-test mode is entered, the selector changes over to the input terminal side, so the entry command is input into the device, causing test mode selector circuit 126 to make second activation signal WBIZ2 H level, and to make start signal øSTART H level.

Hereinabove, in the seventh embodiment, the test address WBI-ADD, test operation command WBI-CMD and test data WBI-DATA that are generated by the self-test circuit BIST can be supplied from a circuit that is as close as possible to the input terminal. Consequently, the test can be conducted in a more precise condition. Also, even if the self-test mode is entered by mistake in the normal condition, the selector can be forcibly changed over to the input terminal side, so that this self-test mode can be canceled.

Eighth Embodiment

The eighth embodiment relates to the reset operation in self-test mode. In a device such as a DRAM, there are provided a large number of latch circuits such as flip-flops in the interior. Consequently, there is provided a function of resetting these latch circuits in response to a reset command from outside or on connection of the power source. In the same way, even in self-test mode, a function of resetting the internal circuitry is needed. In this embodiment, a reset function is implemented in the self-test mode.

FIG. 29 is a view given in explanation of the reset function in the eighth embodiment. FIG. 29A is a layout diagram of the entire device, illustrating a main circuit 300 of the memory that includes memory banks and/or control circuitry etc, a self-test circuit BIST, and a reset signal generating circuit 305 that supplies these reset signals RESET1, 2, 3. Also, FIG. 29B shows reset signal generating circuit 305 and FIG. 29C shows a table illustrating the relationship between the reset request signals S1, S2, S3 and reset signals RESET1, 2, 3.

Start circuit 304 generates a first reset request signal S1 in response to connection of power source VDD. In response to this, reset signal generating circuit 305 generates a first reset signal RESET1 for main circuit 300 excluding command decoder 302, a second reset signal RESET2 for command decoder 302, and a third reset signal RESET3 for self-test circuit BIST. As a result, the latch circuits incorporated in main circuit 300, commander decoder 302 and self-test circuit BIST are reset.

When a forcible reset command is input from outside, secondary reset request signal S2 is generated as a forcible reset signal by command decoder 302. In response to this, reset signal generating circuit 305 generates a first reset signal RESET1 for main circuit in 300 excluding command decoder 302 and a third reset signal RESET3 for self-test circuit BIST. As a result, the latch circuits incorporated in main circuit 300 and self-test circuit BIST are reset. However, the command decoder 302 that outputs the second reset request signal S2 is not reset.

When a reset command is serially input from the test terminal WBIZ that is employed for the self-test at wafer level, self-test circuit BIST generates third reset request signal S3. In response to this, reset signal generating circuit 305 generates first reset signal RESET1 for main circuit 300 and reset signal RESET2 for command decoder 302. As a result, the latch circuit incorporated in main circuit 300 and/or command decoder 302 are reset. In this case, no third reset signal RESET3 is generated. As a result, the self-test circuit BIST is not reset, and the third reset request signal S3 is held, so that reset of main circuit 300 is correctly performed.

Figure 30:
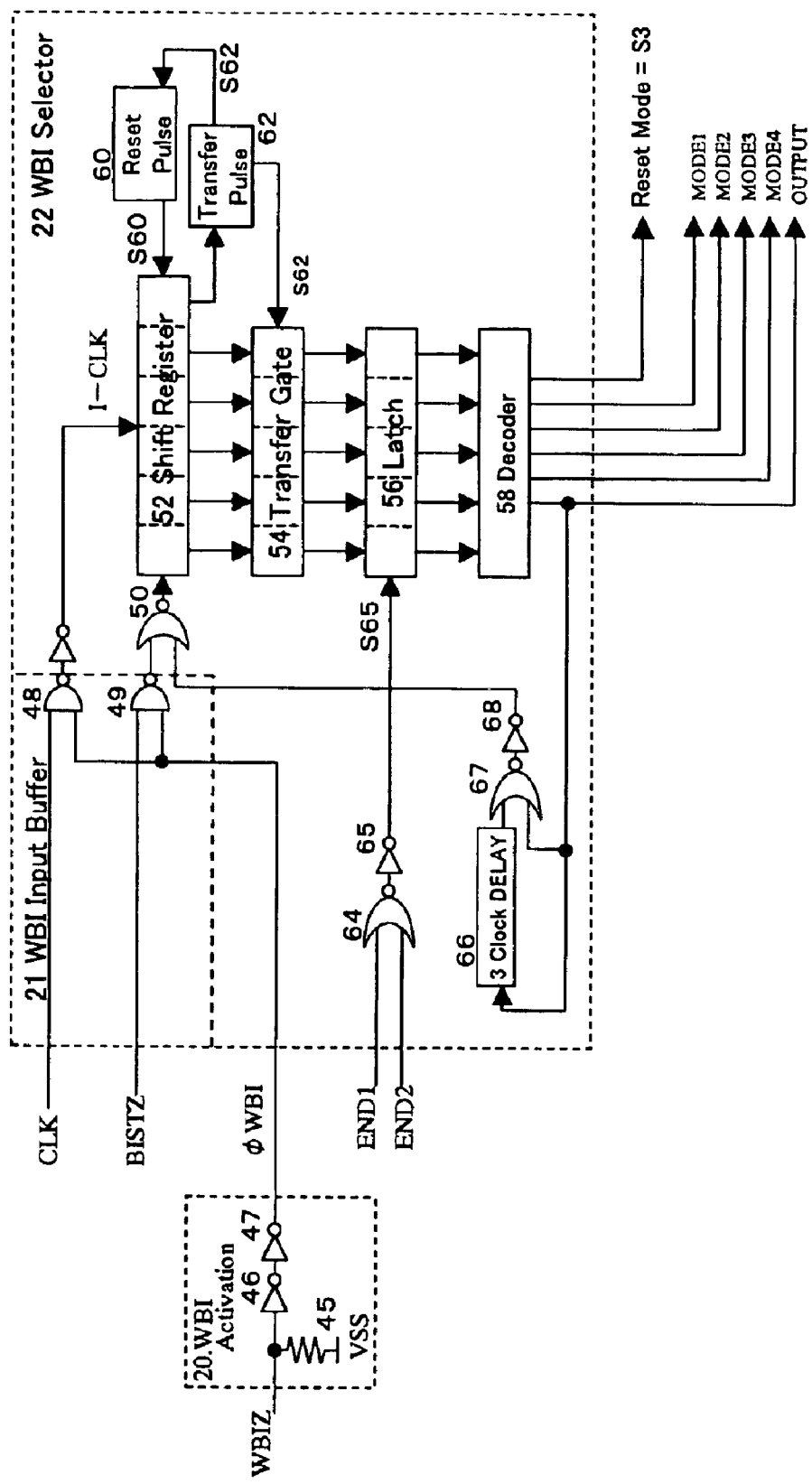
FIG. 30 is a view illustrating a WBI mode selector circuit according to the eighth embodiment.

FIG. 30 is a view showing a WBI mode selector circuit that generates a reset request signal S3 in response to a serial command from test terminal WBIZ. Since FIG. 30 is a modified example of FIG. 3, the same reference numerals are employed. The circuit layout of FIG. 30 is the same as that of FIG. 3. However, when a reset command is serially input from test terminal WBIZ, decoder 58 generates reset request signal S3 as a fifth WBI mode select signal. In response to this reset request signal S3, the reset signal generating circuit 305 shown in FIG. 29 generates a reset signal RESET1 for main circuit 300.

In the above, according to the present invention, instead of employing an LSI tester, a self-test circuit incorporated in the memory device can perform checking for failed bits by being supplied with a self-test activation signal from outside. Consequently, the time required for the test step can be shortened compared with a conventional memory device.

Also, according to the present invention, even in a burn-in test in which a small number of external terminals are utilized in the wafer step, a self-test can be performed by utilizing the incorporated self-test circuit, thereby contributing to lowering the costs of the device.

The scope of protection of the present invention above is not restricted to the above embodiments but extends to the invention as set out in the claims and equivalents thereof.

What is claimed is:

1. A self-test circuit that detects defects of a memory device, incorporated in the memory device having a memory control circuit that controls write and read operations with respect to a memory core in response to a command, comprising:

a test operation command generating circuit that, in self-test activated condition, generates a test operation command that designates said writing or reading, and that supplies the test operation command to said memory control circuit;

a test address generating circuit that, in said self-test activated condition, generates a test address and supplies the test address to said memory core;

a test data generating circuit that, in said self-test activated condition, generates test data and supplies the test data to said memory core;

a test output circuit that compares read data from said memory core with said test data and stores information as to the result of this comparison, and outputs the information to the outside; and a test operation mode selector circuit that, in said self-test activated condition, generates a test operation mode signal that designates any of a plurality of test operation modes including said write or read in response to a test operation mode input signal from outside, wherein, in response to said test operation mode signal, said test operation command generating circuit generates said test operation command for executing said test operation mode, wherein said self-test circuit goes into the self-test activated condition in response to a self-test activation signal from outside.

2. The memory device self-test circuit of claim 1 wherein said test operation mode selector circuit generates said test operation mode signal by decoding a plurality of test operation mode input signals supplied from outside.

3. The memory device self-test circuit of claim 2 wherein said plurality of test operation mode input signals are serially input in synchronization with an input timing signal.

4. The memory device self-test circuit of claim 3 wherein said input timing signal is a test clock signal that is generated based on a clock supplied from outside.

5. The memory device self-test circuit of claim 1 wherein said test operation mode selector circuit sequentially generates said plurality of test operation mode signals in said test activation condition.

6. The memory device self-test circuit of claim 1 wherein the self-test activation signal is one or other of a signal supplied from a self-test input terminal or a signal generated in response to a prescribed command of said memory device.

7. The memory device self-test circuit of claim 6 wherein said self-test input terminal is maintained at a prescribed potential in the open condition.

8. The memory device self-test circuit of claim 1 wherein said test operation command generating circuit sequentially generates a plurality of test operation command corresponding to operations including at least one of said write or read, every time a particular address is generated by said test address generating circuit.

9. The memory device self-test circuit of claim 8 wherein said test operation command generating circuit generates said test operation command in synchronization with a command generation timing signal that is generated from a clock supplied from outside.

10. The memory device self-test circuit of claim 1 wherein said test address generating circuit comprises an address counter and said test address is generated by counting an address timing signal for address incrementing or decrementing.

11. The memory device self-test circuit of claim 10 wherein said address counter of the test address generating circuit selectively outputs a non-inverted output or inverted output of the counter value, in accordance with said test operation mode signal.

12. The memory device self-test circuit of claim 10 wherein said address timing signal is a test clock signal that is generated from a clock supplied from outside.

13. The memory device self-test circuit of either of claim 9 or 12 further comprising an oscillator that generates an internally generated clock in the self-test activation condition, and wherein said timing signal is generated from the internally generated clock.

14. The memory device self-test circuit of claim 1 wherein, when said test operation command corresponds to write operation, said test data generating circuit supplies the test data to said memory core as write data and, when said test operation command corresponds to read operation, said test data generating circuit supplies the test data to said test output circuit as comparison data.

15. The memory device self-test circuit of claim 14 wherein said test data generating circuit generates said test data in a prescribed pattern in accordance with said test address signal in synchronization with said address timing signal.

16. The memory device self-test circuit of claim 1 wherein said test output circuit comprises a counter that counts the number of times of non-coincidence of said read data and the test data.

17. The memory device self-test circuit of claim 16 wherein the counter of said test output circuit has as its maximum count value a number of times of said non-coincidence corresponding to at least the maximum number of failed bits that can be rescued.

18. The memory device self-test circuit of claim 17 wherein the counter of said test output circuit generates an overflow signal when its count value exceeds said maximum count value, and outputs the fact that the overflow has occurred.

19. The memory device self-test circuit of claim 1 wherein said test output circuit comprises a parallel/serial conversion circuit and serially outputs said comparison result information in synchronization with an output timing signal.

20. The memory device self-test circuit of claim 1 wherein said test output circuit outputs, as said comparison result information, information as to whether or not the number of times of non-coincidence of said read data and test data is equal to or below the number of times that can be rescued.

21. The memory device self-test circuit of claim 20 wherein said test output circuit further outputs, as said comparison result information, information that non-coincidence of said read data and test data did not occur.

22. The memory device self-test circuit of claim 20 wherein said test output circuit further outputs, as said comparison result information, the number of times of said non-coincidence.

23. The memory device self-test circuit of claim 19 wherein said output timing signal is a test clock signal that is generated from a clock supplied from outside.

24. The memory device self-test circuit of claim 4, 9, 12 or 23 further comprising a clock multiplication circuit that generates an internally generated clock by multiplying said clock supplied from outside and
wherein said timing signal is generated from the internally generated clock.

25. A memory device including a memory core having a plurality of memory cells and a memory control circuit that controls write and read operations in respect of said memory core in response to an external command, in which writing or reading of said memory cells corresponding to an external address is performed, said memory device comprising:

a self-test circuit that detect defects of said memory device by assuming a self-test activation condition in response to a self-test activation signal from outside;

wherein said self-test circuit comprises:

a test operation command generating circuit that, in said test activated condition, generates a test operation command that designates said writing or reading, and supplies the test operation command to said memory control circuit;

a test address generating circuit that, in said self-test activated condition, generates a test address and supplies the test address to said memory core;

a test data generating circuit that, in said self-test activated condition, generates test data and supplies the test data as write data to said memory core;

a test output circuit that compares read data from said memory core with said test data and stores the comparison result information; and a test operation mode selector circuit that, in said self-test activated condition, generates a test operation mode signal that designates any of a plurality of test operation modes including said write or read in response to a test operation mode input signal from outside, wherein, in response to said test operation mode signal, said test operation command generating circuit generates said test operation command for executing said test operation mode.

26. The memory device of claim 25 comprising:
a first selector that changes over said external command and said test command;
a second selector that changes over said external address and said test address; and
a third selector that changes over external write data supplied from the outside and said test data.

27. The memory device of claim 26 further comprising:
a clock multiplier circuit that generates an internally generated clock by multiplying an external clock supplied from outside; and
a fourth selector that changes over said external clock and said internally generated clock.

28. The memory device of claim 26 further comprising:
an oscillator that generates an internally generated clock in the self-test activated condition; and
a fourth selector that changes over said external clock and said internally generated clock.

29. The memory device of claim 26 further comprising:
a data output circuit that outputs read data that is read from said memory cells; and
a fifth selector that changes over the comparison result information from said test output circuit and said read data and supplies this to said data output circuit.

30. The memory device of claim 26 wherein at least one of said first, second and third selectors is provided at a corresponding input circuit, and
said input circuit inputs an input signal that is changed over by said selector in synchronization with a first clock and said self-test circuit supplies to said selector a corresponding signal from among said test command, test address, or test data in synchronization with a second clock which is advanced in phase from said first clock.

31. The memory device of claim 30, wherein said input circuit comprises an input buffer that inputs an external command, external address, and/or external write data, and a latch circuit that latches the output of said input buffer, at least one of said first, second and third selectors being provided between said input buffer and latch circuit.

32. The memory device of claim 30 wherein said input circuit inputs said input signal in synchronization with one edge of the clock and said self-test circuit generates said corresponding signal in synchronization with the other edge of said clock.

33. The memory device of claim 30, wherein said self-test activation signal is one or other of a signal supplied from a self-test input terminal or a signal generated in response to a prescribed external command of said memory device, and
in self-test mode, at least some of said selectors are changed over to the external input terminal side in response to a condition of a prescribed external terminal.

34. The memory device of claim 25, further comprising a self-test external terminal that is supplied with said self-test activation signal.

35. The memory device of claim 25 wherein said self-test activation signal is supplied by a prescribed external command.

36. The memory device of claim 25 wherein a reset signal is supplied to the internal circuitry which includes at least said memory core and memory control circuit, in response to a reset command supplied from a self-test input terminal, and said internal circuit is reset.

37. A memory device comprising:
a memory core having a plurality of memory cells;
a memory control circuit that controls write and read operations to said memory core in response to an external command, in which writing or reading is performed to said memory cells corresponding to an external address;
a self-test circuit that goes into self-test activated condition in response to a self-test activation signal from outside; that generates a test operation command that designates said writing or reading and supplies said command to said memory control circuit, generates a test address and supplies the test address to said memory core, generates test data and supplies the test data as write data to said memory core, and detects defects of said memory device by comparing the read data from said memory core and said test data; and
a test operation mode selector circuit that, in said self-test activated condition, generates a test operation mode signal that designates any of a plurality of test operation modes including said write or read in response to a test operation mode input signal from outside, wherein, in response to said test operation mode signal, said test operation command generating circuit generates said test operation command for executing said test operation mode.

38. The memory device of claim 37 further comprising first and second self-test terminals,
wherein the self-test activation signal is input from said first self-test terminal and a test mode command that designates the test mode is input from said second self-test terminal and, furthermore, said comparison result is output from said second self-test terminal.

* * * * *